(12) United States Patent
Meade et al.

(10) Patent No.: US 10,775,576 B2
(45) Date of Patent: Sep. 15, 2020

(54) THERMAL MANAGEMENT SYSTEM FOR MULTI-CHIP-MODULE AND ASSOCIATED METHODS

(71) Applicant: Ayar Labs, Inc., Emeryville, CA (US)

(72) Inventors: Roy Edward Meade, Boise, ID (US); Vladimir Stojanovic, Berkeley, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 0 days.

(21) Appl. No.: 16/287,984

(22) Filed: Feb. 27, 2019

(65) Prior Publication Data

US 2019/0271819 A1 Sep. 5, 2019

Related U.S. Application Data

(60) Provisional application No. 62/637,357, filed on Mar. 1, 2018.

(51) Int. Cl.
| | |
|---|---|
| *H01L 23/36* | (2006.01) |
| *G02B 6/42* | (2006.01) |
| *H01L 25/00* | (2006.01) |
| *H01L 25/16* | (2006.01) |

(52) U.S. Cl.
CPC ......... *G02B 6/4269* (2013.01); *G02B 6/4271* (2013.01); *H01L 23/36* (2013.01); *H01L 25/165* (2013.01); *H01L 25/50* (2013.01)

(58) Field of Classification Search
None
See application file for complete search history.

(56) References Cited

U.S. PATENT DOCUMENTS

| | | | | |
|---|---|---|---|---|
| 5,276,289 | A * | 1/1994 | Satoh | B23K 35/30 174/260 |
| 2005/0135732 | A1 * | 6/2005 | Crow | G02B 6/4232 385/15 |
| 2013/0043581 | A1 * | 2/2013 | Negoro | H01L 23/13 257/712 |
| 2014/0002989 | A1 * | 1/2014 | Ahuja | G06F 1/20 361/679.54 |
| 2014/0346661 | A1 * | 11/2014 | Liu | H01L 21/4882 257/713 |
| 2015/0162307 | A1 * | 6/2015 | Chen | H01L 23/3672 257/712 |
| 2018/0005985 | A1 * | 1/2018 | Hsieh | H01L 23/367 |
| 2019/0198416 | A1 * | 6/2019 | Neal | H01L 23/367 |

* cited by examiner

*Primary Examiner* — Benjamin P Sandvik
(74) *Attorney, Agent, or Firm* — Penilla IP, APC

(57) ABSTRACT

A plurality of lid structures include at least one lid structure configured to overlie one or more heat sources within a multi-chip-module and at least one lid structure configured to overlie one or more temperature sensitive components within the multi-chip-module. The plurality of lid structures are configured and positioned such that each lid structure is separated from each adjacent lid structure by a corresponding thermal break. A heat spreader assembly is positioned in thermally conductive interface with the plurality of lid structures. The heat spreader assembly is configured to cover an aggregation of the plurality of lid structures. The heat spreader assembly includes a plurality of separately defined heat transfer members respectively configured and positioned to overlie the plurality of lid structures. The heat spreader assembly is configured to limit heat transfer between different heat transfer members within the heat spreader assembly.

28 Claims, 14 Drawing Sheets

THERMAL MANAGEMENT SYSTEM FOR MULTI-CHIP-MODULE AND ASSOCIATED METHODS

CLAIM OF PRIORITY

This application claims priority under 35 U.S.C. 119(e) to U.S. Provisional Patent Application No. 62/637,357, filed Mar. 1, 2018, the disclosure of which is incorporated herein by reference in its entirety for all purposes.

BACKGROUND

1. Field of the Invention

The present invention relates to optical data communication.

2. Description of the Related Art

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient laser light sources and optical processing devices. Also, it is desirable for the laser light sources and optical processing devices of optical data communication systems to have a minimal form factor and be designed as efficiently as possible with regard to expense and energy consumption. Also, in some optical data processing systems, one or more temperature sensitive devices, such as optical devices and/or optoelectronic devices, may be positioned in proximity to one or more heat generating devices. Heat emanating from the one or more heat generating devices should be managed to avoid adversely affecting operation of the one or more temperature sensitive devices. It is within this context that the present invention arises.

SUMMARY

In an example embodiment, a thermal management system for a multi-chip-module is disclosed. The thermal management system includes a plurality of lid structures, including at least one lid structure configured to overlie one or more heat sources within the multi-chip-module, and at least one lid structure configured to overlie one or more temperature sensitive components within the multi-chip-module. The plurality of lid structures are configured and positioned such that each lid structure is separated from each adjacent lid structure by a corresponding thermal break. A heat spreader assembly is positioned in thermally conductive interface with the plurality of lid structures. The heat spreader assembly is configured to cover an aggregation of the plurality of lid structures. The heat spreader assembly includes a plurality of separately defined heat transfer members respectively configured and positioned to overlie the plurality of lid structures. The heat spreader assembly is configured to limit heat transfer between different heat transfer members within the heat spreader assembly.

In an example embodiment, a method is disclosed for thermal management of a multi-chip-module. The method includes positioning a first lid structure over a temperature sensitive component within the multi-chip-module. The method also includes positioning a second lid structure over a heat source within the multi-chip-module. The second lid structure is separated from the first lid structure by a thermal break. The method also includes positioning a heat spreader assembly in thermally conductive interface with both the first lid structure and the second lid structure. The heat spreader assembly includes a first heat transfer member configured and positioned to overlie the first lid structure. The heat spreader assembly includes a second heat transfer member configured and positioned to overlie the second lid structure. The heat spreader assembly is configured to limit heat transfer between the first heat transfer member and the second heat transfer member.

DETAILED DESCRIPTION

Figure 1:
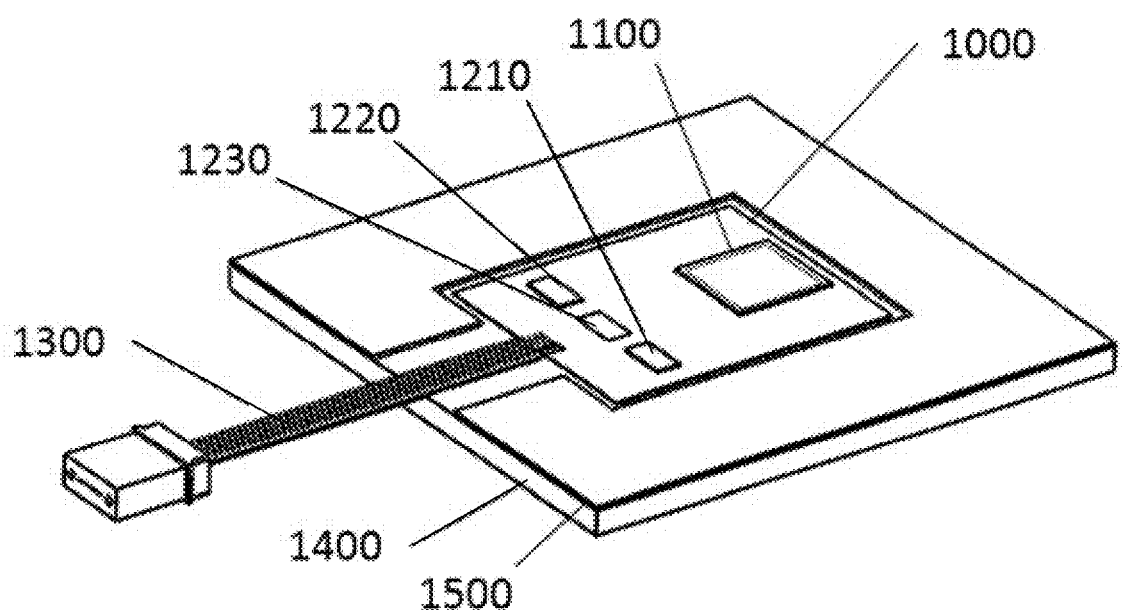
FIG. 1 shows a diagram of an example multi-chip-module (MCM), in accordance with some embodiments of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

A Multi-Chip-Module (MCM) can be composed of heterogeneous components. For silicon photonic MCM's, these components can include III-V material, in addition to one or more CMOS (Complementary Metal-Oxide Semiconductor) die. A III-V material is a semiconductor compound containing elements from Group III (Boron, Aluminum, Gallium, Indium, Thallium) and Group V (Nitrogen, Phosphorous, Arsenic, Antimony, Bismuth) of the periodic table. In some applications, the Total Dissipated Power (TDP) within an MCM can exceed 200 Watts (W), resulting in semiconductor junction temperatures in excess of 90° Celsius (C), and sometimes over 100° C. While CMOS devices can nominally operate at these temperatures, the same cannot be said of III-V materials. For example, lasers (e.g., DFB (distributed feedback laser), DBR (distributed Bragg reflector laser), FP (Fabry-Perot laser) and semiconductor optical amplifiers (SOA) formed of III-V material will suffer significant reduction in both their wall plug efficiency and mean time to failure (MTTF) when operating at such high temperatures. Such adverse operational behavior at high operating temperature can limit the utility of heterogeneous MCM's.

Embodiments are disclosed herein for a thermal management system for an MCM that provides one or more thermal paths from one or more elevated temperature region(s) within the MCM to an ambient environment, i.e., to an environment outside the MCM. The thermal management system creates separate thermal-transfer-environments for separate regions of the MCM or similar assembly of heterogeneous components. Each thermal-transfer-environment can be referred to as a "micro-environment." The thermal management system disclosed herein can also be referred to as an Integrated Cooling Environment (ICE).

A design consideration and challenge for electronic packaging is heat spreading. For ideal heat sink behavior, a base of the electronic packaging would have uniform temperature. However, semiconductor die act as non-uniform heat sources. In this situation, a heat spreader plates can be included within the thermal design to improve the thermal resistance. In some configurations, the base of the heat sink functions as the heat spreader plate. In some configurations, vapor chambers and heat pipes can be used to improve heat spreading. For heterogeneous MCM's, heat spreading is also a concern. Embodiments of the thermal management system disclosed herein function to increase heat spreading within separate regions of the MCM, while retarding heat spreading between those separate regions of the MCM.

There are three primary modes of heat transfer: conduction, convection, and radiation. For temperatures less than 100° C., radiation is usually neglected. Within the MCM package, convection can be neglected too. Therefore, the dominant mode for heat transfer within the MCM package is conduction. The thermal management system disclosed herein is a composite structure that includes strategically placed "thermal breaks" to thermally isolate separate regions of the MCM.

FIG. 1 shows a diagram of an example MCM, in accordance with some embodiments of the present invention. The MCM includes an interposer device 1000. In various embodiments, the interposer device 1000 can include a number of optical waveguides and/or local metal routing and/or through-silicon vias (TSV's). In various embodiments, the interposer device 1000 can be formed of a silicon-based material, ceramic, glass, or of an organic composite material, among other materials. The MCM also includes a silicon photonics die 1100. In some embodiments, the silicon photonics die 1100 can include one or more CMOS device(s) as well as passive and/or active photonic devices. In various embodiments, the MCM can include one or more silicon photonics die 1100. Also, in various embodiments, the MCM can include a plurality of silicon photonics die 1100 and/or CMOS die on the interposer device 1000. The silicon photonics die 1100 and/or CMOS die that are present on the interposer device 1000 are spatially separated from III-V material die present on the interposer device 1000.

The MCM also includes a number of SOA's or other III-V material die 1210, 1220. The SOA's and other III-V material die are more susceptible to temperature-induced problems. Therefore, the SOA's and other III-V material die are spatially separated on the interposer device 1000 from the silicon photonics die 1100 and/or other CMOS die that may behave as heat sources. In some embodiments, the MCM can also include a laser die 1230 (such as a distributed feedback (DFB) laser die, by way of example) and/or other III-V material die, that are more susceptible to temperature-induced problems. Again, the laser die 1230 and other III-V material die are spatially separated on the interposer device 1000 from the silicon photonics die 1100 and/or other CMOS die. Also, in some embodiments, the MCM includes an optical fiber-to-chip or optical fiber-to-interposer assembly 1300. As shown in the example of FIG. 1, in some embodiments, the optical fiber-to-chip or optical fiber-to-interposer assembly 1300 can be a 12 optical fiber MT (mechanical transfer) ferrule configured for connection to the interposer device 1000. However, it should be understood that in other embodiments, the optical fiber-to-chip or optical fiber-to-interposer assembly 1300 can be essentially any other type and/or configuration of optical data communication connection(s) to the interposer device 1000. Also, it should be understood that in various embodiments, a plurality of optical fiber-to-chip assemblies and/or optical fiber-to-interposer assemblies can be implemented/utilized.

The MCM also includes a substrate device 1400 that serves to fanout electrical signal(s) while concurrently providing a power supply, e.g., Vdd, Vss, etc., to devices of the MCM. In various embodiments, the substrate device 1400 can be fabricated from one or more of essentially any material used in electronic packages, such as epoxy composite structures, ceramic, and/or glass, among other materials. The substrate device 1400 can be configured to interface with one or more of a Land Grid Array (LGA), and/or a Ball Grid Array (BGA), and/or any other substrate electrical connection technology/scheme available in the semiconductor device industry. Also, in some embodiments, if the substrate device 1400 has sufficient planarity and features, e.g., electrical routing and optical routing, the substrate device 1400 can be configured to provide functionality equivalent to the interposer device 1000. And, in some of these embodiments, and the interposer device 1000 can be eliminated from the MCM.

The example MCM of FIG. 1 also includes a stiffener structure 1500. In some embodiments, such as shown in the example of FIG. 1, the stiffener structure 1500 is "C-shaped." In some embodiments, the C-shaped stiffener structure 1500 can be used when the substrate device 1400 does not allow for cavities, such as when the substrate device 1400 is formed in accordance with organic substrate technology. It should be understood, however, that in various embodiments in which cavities can be formed within the substrate device 1400, the stiffener structure 1500 can have a different shape that is not C-shaped. Also, in various embodiments, the stiffener structure can have different thicknesses. In the example MCM of FIG. 1, the stiffener structure 1500 has a thickness large enough to accommodate passage of the fiber-to-chip/fiber-to-interposer assembly 1300 through a layer (vertical layer) of the MCM where the stiffener structure 1500 resides. Also, in the example MCM of FIG. 1, the stiffener structure 1500 has a thickness large enough to extend vertically (as measured in the thickness direction) beyond a vertical extent of various die disposed on the interposer device 1000 (such as the silicon photonics/CMOS die 1100, the SOA/III-V material die 1210, 1220, and the laser/III-V material die 1230), so that when a lid structure 1710, 1720 (see FIG. 3A) is positioned on the top of the stiffener structure 1500, the lid structure 1710, 1720 does not physically press into the various die disposed on the interposer device 1000.

Figure 2:
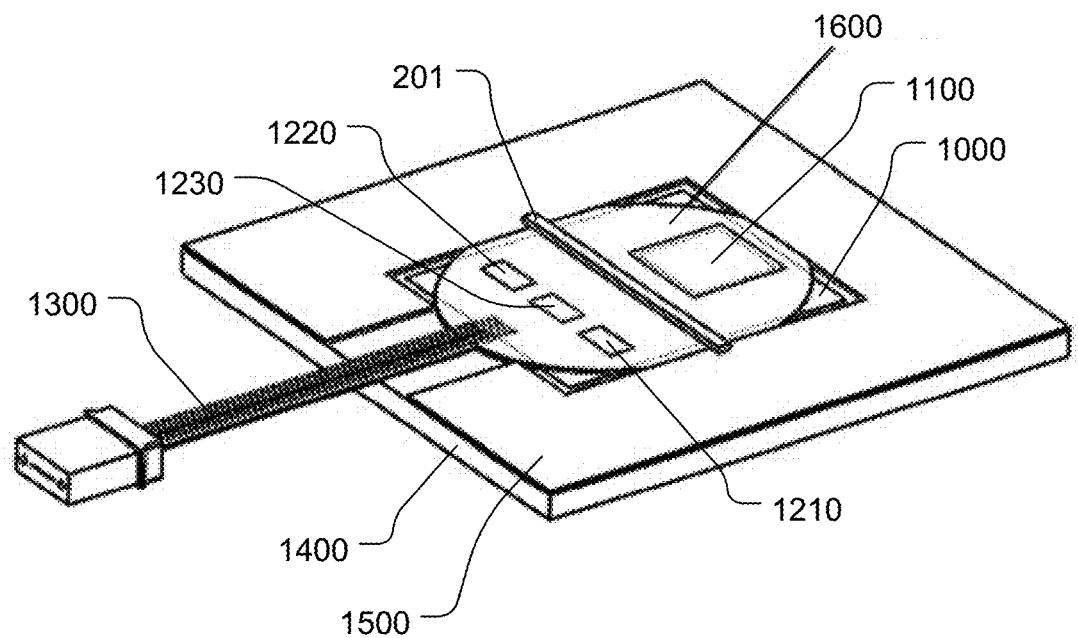
FIG. 2 shows the example MCM of FIG. 1, with a Thermal Interface Material (TIM) disposed over the interposer device and over the various die disposed on the interposer device, in accordance with some embodiments of the present invention.

It should be understood that the example MCM of FIG. 1 is depicted in a simplified manner to avoid unnecessarily obscuring description of the present invention. In various embodiments, the example MCM of FIG. 1 can include adhesives and/or solder for attaching various components to each other. Also, in various embodiments, standard electronic packaging techniques can be used to assemble the MCM. For example, a Capillary Underfill (CUF) technique can be used to adhere the silicon photonics/CMOS die 1100 to the interposer device 1000. FIG. 2 shows the example MCM of FIG. 1, with a Thermal Interface Material (TIM) 1600 disposed over the interposer device 1000 and over the various die disposed on the interposer device 1000, such as over the silicon photonics/CMOS die 1100, the SOA/III-V material die 1210, 1220, and laser/III-V material die 1230, in accordance with some embodiments of the present invention. In some embodiments, the TIM 1600 is dispensed onto the MCM as a viscous/flowable material. As the lid structures 1710, 1720 are attached to the MCM, e.g., are positioned on the top surface of the stiffener structure 1500 to cover the interposer device 1000, the lid structures 1710, 1720 displace the TIM 1600 and cause the TIM 1600 to flow within a volume that is bounded by a combination of the stiffener structure 1500, the lid structures 1710, 1720, the interposer device 1000, and the substrate device 1400. It should be understood that in various embodiments, the TIM 1600 does not need to fill the entire volume that is bounded by the combination of the stiffener structure 1500, the lid structures 1710, 1720, the interposer device 1000, and the substrate device 1400. In some embodiments, the TIM 1600 is disposed to just occupy an interior space between and around the silicon photonics/CMOS die 1100, the SOA/III-V material die 1210, 1220, and the laser/III-V material die 1230, where the interior space is surrounded by the stiffener structure 1500 and is vertically bounded by the interposer device 1000 and the lid structures 1710, 1720 that are positioned on top of the stiffener structure 1500.

In some embodiments, an underside of the lid structures 1710, 1720 can include various physical features that form corresponding physical features within the TIM 1600. For example, FIG. 2 shows a ridge feature 201 that bisects the TIM 1600, and that is formed by placement of the lid structures 1710, 1720 on the stiffener structure 1500. In various embodiments, the size, shape, and placement of the lid structures 1710, 1720 can be defined to form essentially any necessary configuration of physical feature with the TIM 1600.

It should be understood that the configuration of the stiffener structure 1500 sets the thickness of the TIM 1600. Therefore, as the thickness of the stiffener structure 1500 increases, the thickness of the TIM 1600 increases. And, as the thickness of the stiffener structure 1500 decreases, the thickness of the TIM 1600 decreases. As the thickness of the TIM 1600 decreases, the thermal resistance through the TIM 1600 decreases. Therefore, to increase heat transfer through the TIM 1600, it is desirable to have a thinner stiffener structure 1500 and a correspondingly thinner TIM 1600.

The TIM 1600 is a material that is contaminant-free and chemically compatible with the materials of the interposer device 1000 and the various die disposed on the interposer device 1000. The TIM 1600 also has a viscosity high enough so that the TIM 1600 will remain in place during the lifetime of the MCM. Also, the TIM 1600 is a material of lowest possible/available thermal resistance. For example, in some embodiments, a thermal conductivity of the TIM 1600 can be on the order of magnitude of about 1 Watt per meter-Kelvin (W/m-K). By way of comparison to the low thermal conductivity of the TIM 1600 of about 1 W/m-K, copper has a much higher thermal conductivity of about 385 W/m-K. Therefore, the TIM 1600 is considered a poor conductor of thermal energy. In some embodiments, the lid structures 1710 and 1720 are separated from each other by a distance of about 1 millimeter, and the vertical distance between the die disposed on the interposer device 1000 and the lid structures 1710 and 1720 is less than about 50 micrometers. Therefore, the thickness of the vertical conductive path through the TIM 1600 is orders of magnitude smaller than the lateral dimension of the TIM 1600. In some embodiments, the TIM 1600 can be COOL-GREASE® or COOL-GEL® or COOL-SILVER™ or COOL-GAPFILL™ by AI Technology, Inc. In some embodiments, the TIM 1600 can be Master Bond EP30TC by Master Bond Inc. In some embodiments, the TIM 1600 can be a metal or metal alloy, such as Indium (In), Indium-Lead (InPb), among other materials. It should be understood that in various embodiments, the TIM 1600 can be essentially any thermal interface material that is used in semiconductor packaging to enhance thermal coupling between components, such as thermal grease, thermal adhesive, and/or thermal gap filler, among others.

Figure 3A:
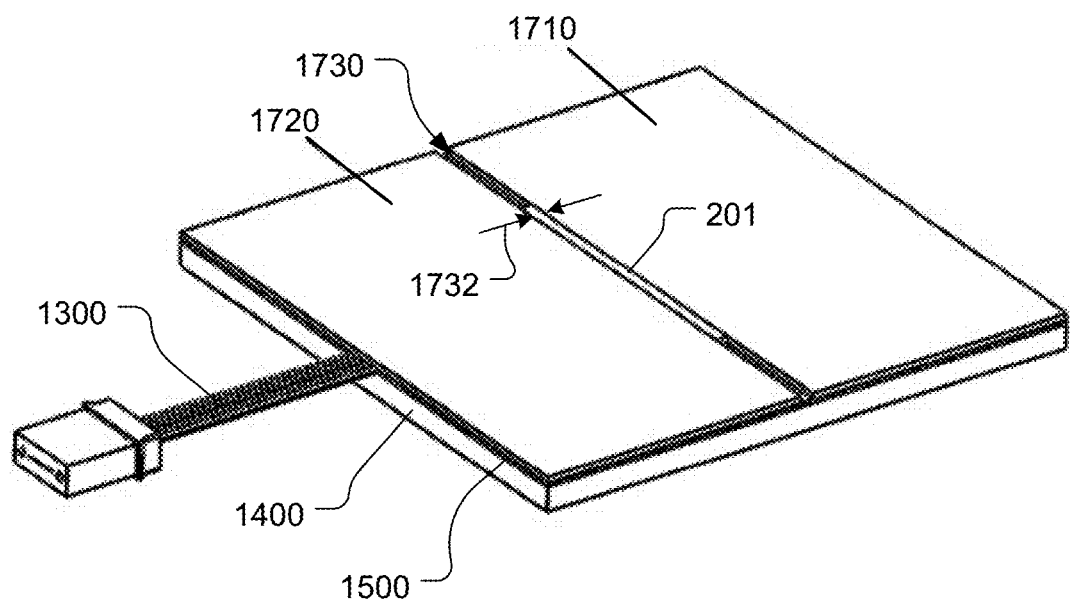
FIG. 3A shows the example MCM of FIG. 2, with lid structures positioned on the top surface of the stiffener structure to cover the interposer device, in accordance with some embodiments of the present invention.
Figure 3B:
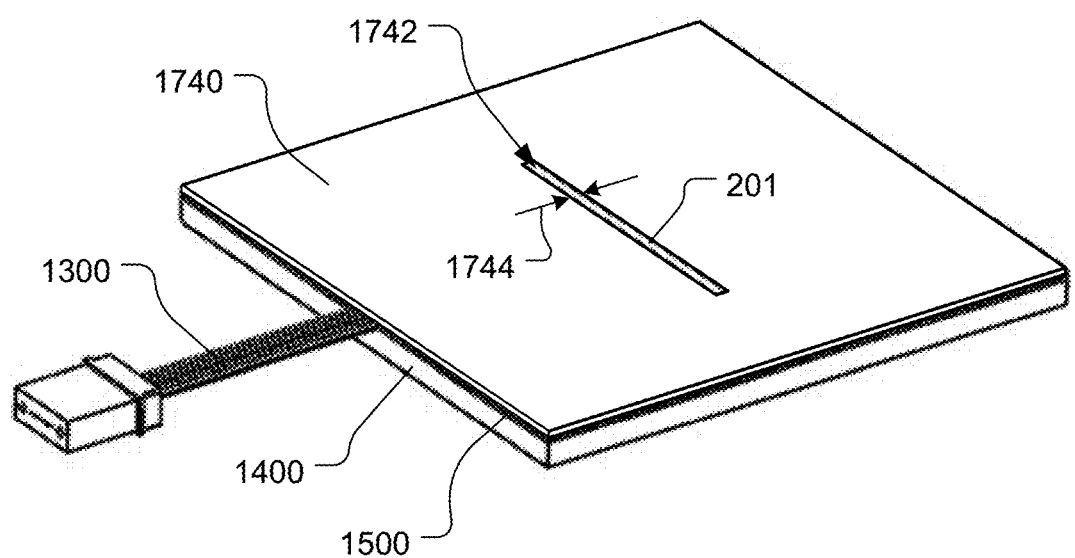
FIG. 3B shows use of a single lid structure with a gap cut through a center region of the single lid structure to form a thermal break, in accordance with some embodiments of the present invention.

FIG. 3A shows the example MCM of FIG. 2, with lid structures 1710 and 1720 positioned on the top surface of the stiffener structure 1500 to cover the interposer device 1000 and cause the TIM 1600 to flow within the volume that is bounded by the stiffener structure 1500, the lid structures 1710, 1720, the interposer device 1000, and the substrate device 1400, in accordance with some embodiments of the present invention. In some embodiments, the lid structures 1710 and 1720 are two separate pieces and are physically separated from each other by a gap 1730 so as to form a thermal break between the two lid structures 1710 and 1720. In some embodiments, a lid configuration for placement on the stiffener structure 1500 can be a single lid structure or more than two lid structures. For example, FIG. 3B shows use of a single lid structure 1740 with a gap 1742 cut through a center region of the single lid structure 1740 to form a thermal break, in accordance with some embodiments of the present invention. In some embodiments, an amount of the TIM 1600 may flow into the gap 1730/1742 to form the ridge feature 201 that bisects the TIM 1600, as previously described with regard to FIG. 2. In some embodiments, the gap 1730 can be filled with a solid material, such as plastic or dielectric material, so that the lid structures 1710 and 1720 and the material that fills the gap 1730 collectively form a single unit structure. In some embodiments, the gap 1742 can be filled with a solid material, such as plastic or dielectric material, so that the lid structure 1740 and the material that fills the gap 1742 collectively form a single unit structure.

With reference to FIG. 3A, the lid structure 1710 is configured to cover the region of the interposer device 1000 where the higher operating temperature silicon photonics/CMOS die 1100 are disposed. And, the lid structure 1720 is configured to cover the region of the interposer device 1000 where the temperature sensitive SOA/III-V material die 1210, 1220, and laser/III-V material die 1230 are disposed. In this manner, the heat transmitted into the lid structure 1710 from the higher operating temperature silicon photonics/CMOS die 1100 does not readily conduct to the lid structure 1720 and into the temperature sensitive SOA/III-V material die 1210, 1220, and laser/III-V material die 1230. In various embodiments, the lid structures 1710 and 1720 are formed of a high thermal conductivity material, such as copper, or aluminum, or copper alloy, or aluminum alloy, among others. In various embodiments, the lid structures 1710 and 1720 are formed of a material having a thermal conductivity of at least 100 W/m-K.

A size 1732 of the gap 1730 corresponds to a minimum heat transfer dimension across the gap 1730 between the lid structures 1710 and 1720. In various embodiments, the size 1732 of the gap 1730 as measured perpendicularly between opposing surfaces of the lid structures 1710 and 1720 is dependent upon a number of parameters, such as the TDP of the various die disposed on the interposer device 1000, the thermal resistance of the TIM 1600, and the thermal resistance to ambient. Similarly, a size 1744 of the gap 1742 corresponds to a minimum heat transfer dimension across the gap 1742 between a portion of the lid structure 1740 overlying a heat source region and a portion of the lid structure 1740 overlying a temperature-sensitive region. The size 1744 of the gap 1742 is dependent upon a number of parameters, such as the TDP of the various die disposed on the interposer device 1000, the thermal resistance of the TIM 1600, and the thermal resistance to ambient.

In some embodiments, the gap 1730/1742 can be kept empty, e.g., the TIM 1600 can be kept out of the gap 1730. However, even if the TIM 1600 flows into the gap 1730/1742, it should be understood that the poor thermal conductivity of the TIM 1600 still allows the gap 1730/1742 to function as a thermal break. And, the size 1732/1744 of the gap 1730/1742 can be very small, even with TIM 1600 present within the gap 1730/1742, with the gap 1730/1742 functioning as a thermal break. More specifically, because the thermal conductivity of the TIM 1600 is so much less than the thermal conductivity of the lid structures 1710, 1720, 1740 (e.g., copper, or aluminum, or copper alloy, or aluminum alloy, among others), even with TIM 1600 present in the gap 1730/1742, the size 1732/1744 of the gap 1730/1742 can be very small. In some embodiments, the size 1732/1744 of the gap 1730/1742 is about 1 millimeter. In some embodiments, the size 1732/1744 of the gap 1730/1742 is less than about 1 millimeter. In some embodiments, the size 1732/1744 of the gap 1730/1742 is less than about 0.5 millimeter. In some embodiments, the size 1732/1744 of the gap 1730/1742 is less than about 0.2 millimeter. Also, in some embodiments, the size 1732/1744 of the gap 1730/1742 is greater than about 1 millimeter.

In various embodiments, a vertical thickness of the lid structures 1710, 1720, 1740, is sufficient to provide for their structural integrity. A smaller vertical thickness of the lid structures 1710, 1720, 1740 will reduce thermal resistance between heat sources underlying the lid structures 1710, 1720, 1740, e.g., the various die disposed on the interposer device 1000, and ambient. However, a larger vertical thickness of the lid structures 1710, 1720, 1740 can provide better thermal spreading between the heat sources underlying the lid structures 1710, 1720, 1740, e.g., the various die disposed on the interposer device 1000, and ambient. Therefore, the vertical thickness of the lid structures 1710, 1720, 1740 can be set to provide a specified trade-off between thermal resistance and thermal spreading with regard to heat transfer from the heat sources underlying the lid structures 1710, 1720, 1740, e.g., the various die disposed on the interposer device 1000, to ambient. In some embodiments, the lid structures 1710, 1720, 1740 have a vertical thickness of about 1 millimeter. In some embodiments, the lid structures 1710, 1720, 1740 have a vertical thickness less than about 1 millimeter. In some embodiments, the lid structures 1710, 1720, 1740 have a vertical thickness more than about 1 millimeter.

Figure 4A:
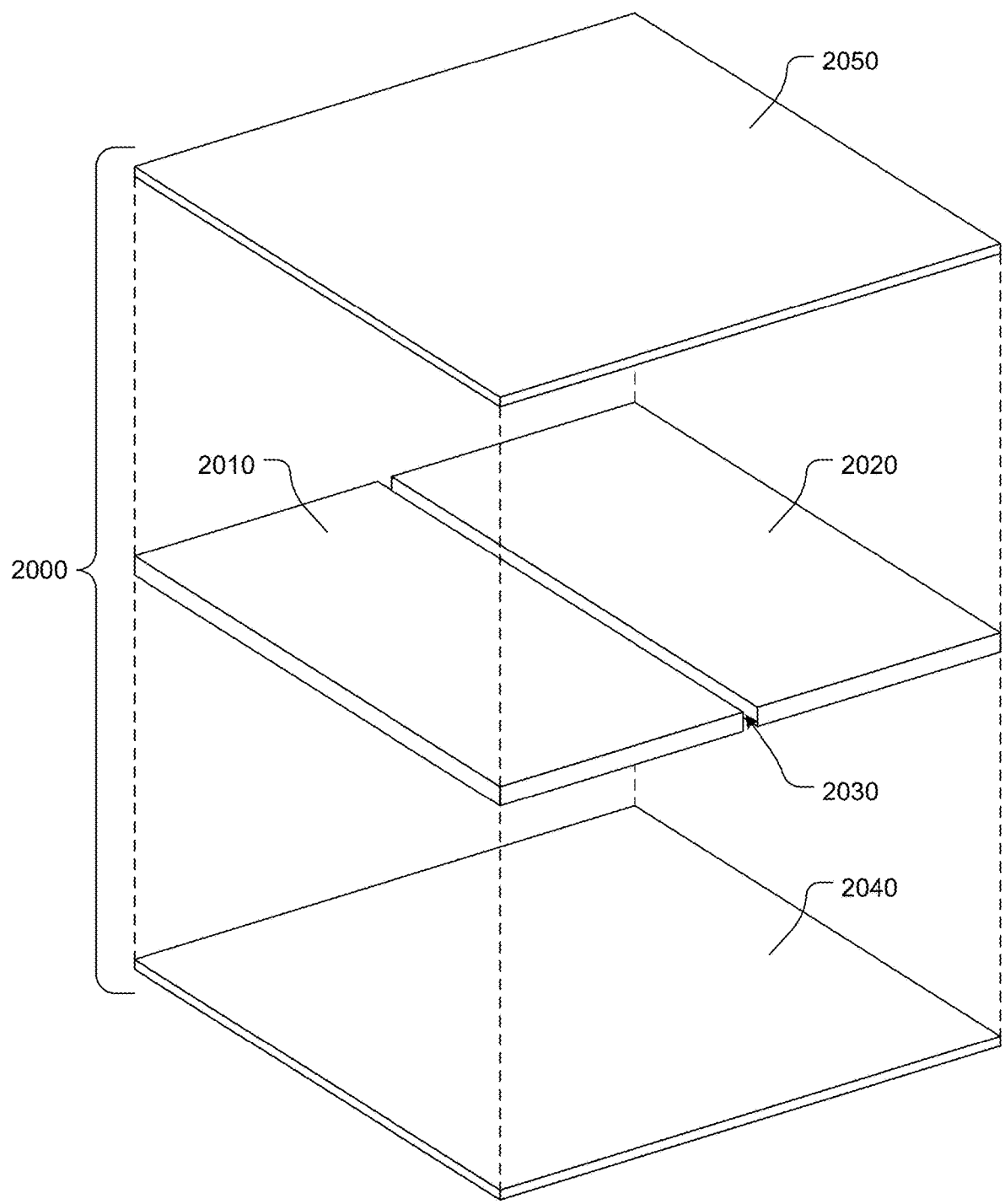
FIG. 4A shows a vertically exploded diagram of a heat spreader assembly configured for positioning on the lid structures, in accordance with some embodiments of the present invention.
Figure 4B:
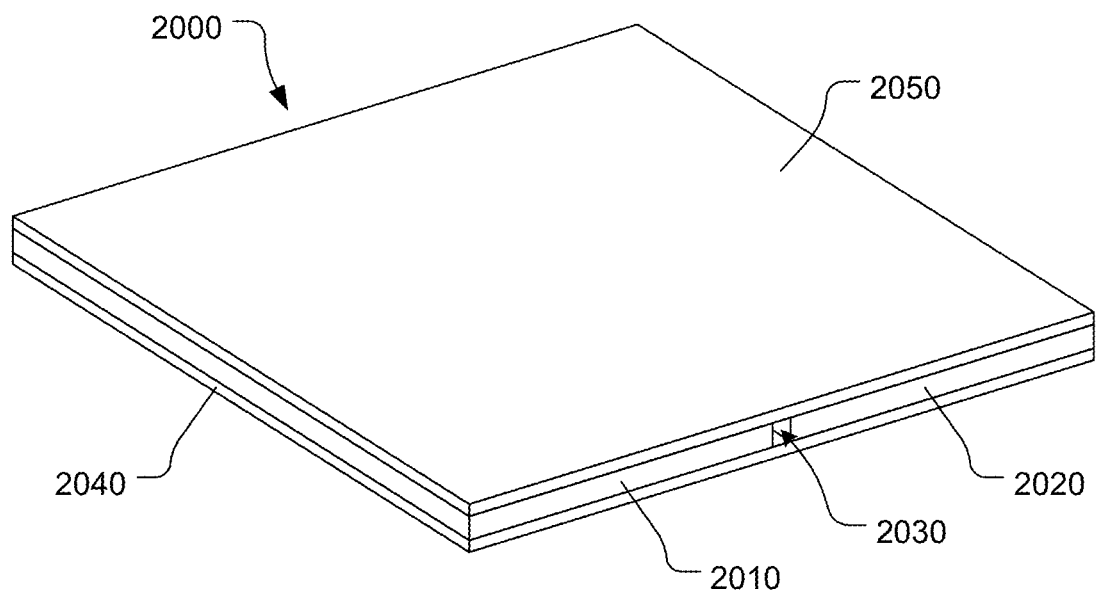
FIG. 4B shows the heat spreader assembly of FIG. 4A in an assembled form, in accordance with some embodiments of the present invention.

FIG. 4A shows a vertically exploded diagram of a heat spreader assembly 2000 configured for positioning on the lid structures 1710, 1720, 1740, in accordance with some embodiments of the present invention. FIG. 4B shows the heat spreader assembly 2000 in an assembled form, in accordance with some embodiments of the present invention. It should be understood that the heat spreader assembly 2000 is provided by way of example, and can be modified in various ways in various embodiments. For example, various features, dimensions, materials, etc., of the heat spreader assembly 2000 can change between different embodiments, depending on specific thermal and/or mechanical needs of the MCM. In the example of FIGS. 4A-4B, the heat spreader assembly 2000 includes two heat transfer members 2010 and 2020 positioned between a lower plate 2040 and an upper plate 2050. Each of the heat transfer members 2010 and 2020 is in thermal contact with each of the lower plate 2040 and the upper plate 2050. And, physical connections between each of the heat transfer members 2010 and 2020 and each of the lower plate 2040 and the upper plate 2050 serve to maintain physical positions of the heat transfer members 2010 and 2020 relative to each other and relative to the lower plate 2040 and the upper plate 2050. It should be understood that in other embodiments, the heat spreader assembly 2000 can include more than two heat transfer members, depending on how the heat sources and temperature-sensitive regions are distributed within the MCM, with the objective being to transfer heat away from the heat sources within the MCM without adversely impacting the temperature-sensitive regions within the MCM.

The heat transfer member 2010 is configured to provide for high thermal conductivity between a portion of the lower plate 2040 in contact with the heat transfer member 2010 and a portion of the upper plate 2050 in contact with the heat transfer member 2010. And, the heat transfer member 2020 is configured to provide for high thermal conductivity between a portion of the lower plate 2040 in contact with the heat transfer member 2020 and a portion of the upper plate 2050 in contact with the heat transfer member 2020. Also, in the example embodiment of FIGS. 4A-4B, a bottom surface of the lower plate 2040 provides a planar surface for good thermal contact with and connection to the lid structures 1710, 1720, 1740.

The vertical thicknesses of the lower plate 2040 and the upper plate 2050 can be set to provide a specified trade-off between thermal resistance and thermal spreading with regard to heat transfer from the heat sources within the MCM to ambient. In some embodiments, the lower plate 2040 can have a vertical thickness of about 1 millimeter. In some embodiments, the lower plate 2040 can have a vertical thickness of less than about 1 millimeter. In some embodiments, the lower plate 2040 can have a vertical thickness of more than about 1 millimeter. In some embodiments, the upper plate 2050 can have a vertical thickness of about 1 millimeter. In some embodiments, the upper plate 2050 can have a vertical thickness of less than about 1 millimeter. In some embodiments, the upper plate 2050 can have a vertical thickness of more than about 1 millimeter. In some embodiments, it can be desirable to have a thinner overall stack thickness of the lower plate 2040, the heat transfer members 2010/2020, and the upper plate 2050. In some embodiments, to achieve the thinner overall stack thickness, the thickness of one or both of the lower plate 2040 and the upper plate 2050 is reduced while maintaining a nominal or larger thickness of the heat transfer members 2010/2020.

In some embodiments, each of the heat transfer members 2010 and 2020 is formed of a solid material, such as solid copper, or solid aluminum, or solid copper alloy, or solid aluminum alloy, or another material having high thermal conductivity. In some embodiments, each of the heat transfer members 2010 and 2020 is formed as a vapor chamber. For example, in some embodiments, each of the heat transfer members 2010 and 2020 can be formed as a vapor chamber that includes a sealed vacuum vessel having an internal wicking structure and an internal working fluid that is in equilibrium with its own vapor. In some embodiments, the sealed vacuum vessel is formed of copper and the internal wicking structure is formed of sintered copper powder on the interior walls of the vacuum vessel. In some embodiments, the working fluid is de-ionized water. It should be understood, however, that in various embodiments, the sealed vacuum vessel, internal wicking structure, and working fluid can be formed of essentially any materials that enable the vapor chamber to function as a suitable heat transfer acceleration device. In some embodiments, the working fluid inside of the vapor chamber vaporizes near a surface of the vapor chamber where heat is applied and condenses at a sufficiently cooler surface of the vapor chamber, with the working fluid recirculating by way of the internal wicking structure. The vaporization of the working fluid serves to spread heat within the vapor chamber and quickly move the heat to the cooler surface of the vapor chamber. In some embodiments, the heat transfer members 2010 and 2020 are formed as vapor chambers that have an effective thermal conductivity that is 5 to 100 times larger than the thermal conductivity of solid copper. In some embodiments, use of vapor chambers for the heat transfer members 2010 and 2020 can provide for improved thermal spreading, as compared to use of a solid material for the heat transfer members 2010 and 2020. The improved thermal spreading provided by configuring the heat transfer members 2010 and 2020 as vapor chambers in turn improves the efficiency of the heat spreader assembly 2000, thereby lowering the overall thermal resistance from the heat sources within the MCM to ambient.

Also, in some embodiments, either of the heat transfer members 2010 and 2020 can be formed as a heat spreader plate having integrated heat pipes. In some embodiments, a heat pipe in this context is a sealed copper tube having an interior that includes a working fluid under a vacuum pressure. The heat pipe also includes an internal wicking structure. In this manner, the heat pipe is quite similar to the vapor chamber described above in both structure and function, with the heat pipe configured to provide for a more directional transfer of heat. The heat pipes can be positioned in thermal contact with the heat spreader plate to provide for transfer of heat away from the heat spreader plate.

In the example heat spreader assembly 2000, the heat transfer members 2010 and 2020 are separated by a thermal break 2030 to limit thermal conduction between the heat transfer members 2010 and 2020. In some embodiments, the thermal break 2030 is formed as an air gap. It should be understood that if the heat spreader assembly 2000 includes more than the two heat transfer members 2010 and 2020, adjacently positioned portions of heat transfer members can be separated from each other by a corresponding thermal break similar to the thermal break 2030. In some embodiments, the lower plate 2040 and the upper plate 2050 are uniform and contiguous, such as shown in FIGS. 4A-4B. In some embodiments, one or both of the lower plate 2040 and the upper plate 2050 can be bifurcated to improve the thermal separation between the two heat transfer members 2010 and 2020. In some embodiments, the lower plate 2040 that is connected to the lid structures 1710 and 1720 is bifurcated in a manner to mirror a physical separation between the lid structures 1710 and 1720. In some embodiments, the lower plate 2040 is omitted from the heat spreader assembly 2000, with the two heat transfer members 2010 and 2020 configured for direct physical connection with the lid structures 1710 and 1720, respectively.

In some embodiments, the lower plate 2040 and the upper plate 2050 may allow for undesired heat transfer between the heat sources within the MCM (e.g., the higher operating temperature silicon photonics/CMOS die 1100) and the temperature sensitive devices within the MCM (e.g., SOA/III-V material die 1210, 1220, and laser/III-V material die 1230). In these embodiments, the lower plate 2040 can be perforated along the boundaries of the two heat transfer members 2010 and 2020 to decrease lateral thermal conduction within the lower plate 2040, and/or the upper plate 2050 can be perforated along the boundaries of the two heat transfer members 2010 and 2020 to decrease lateral thermal conduction within the upper plate 2050, while maintaining overall physical planarity of the heat spreader assembly 2000.

Figure 5A:
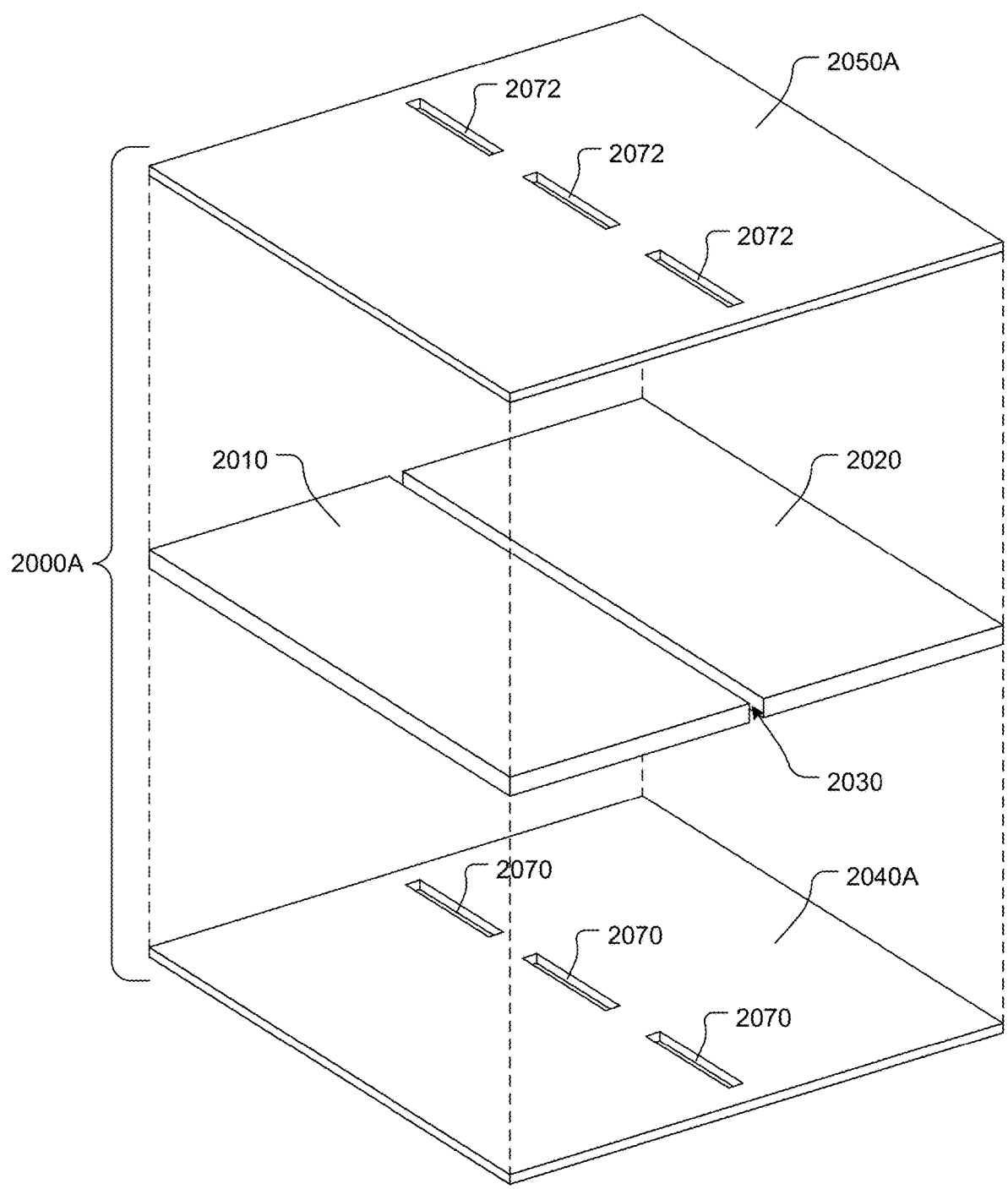
FIG. 5A shows a vertically exploded diagram of a heat spreader assembly that utilizes perforations to reduce lateral thermal conduction within the heat spreader assembly at the location of the thermal break, in accordance with some embodiments of the present invention.
Figure 5B:
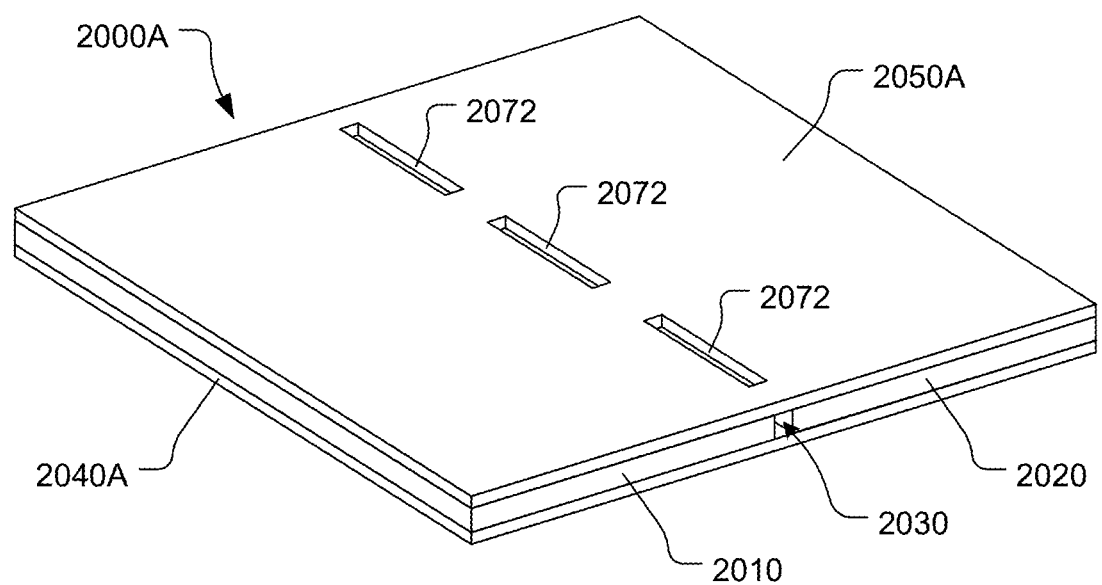
FIG. 5B shows the heat spreader assembly of FIG. 5A in an assembled form, in accordance with some embodiments of the present invention.

FIG. 5A shows a vertically exploded diagram of a heat spreader assembly 2000A that utilizes perforations to reduce lateral thermal conduction within the heat spreader assembly 2000A at the location of the thermal break 2030, in accordance with some embodiments of the present invention. FIG. 5B shows the heat spreader assembly 2000A in an assembled form, in accordance with some embodiments of the present invention. The heat spreader assembly 2000A includes a lower plate 2040A having perforations 2070 along the inner boundaries of the two heat transfer members 2010 and 2020. Similarly, heat spreader assembly 2000A includes an upper plate 2050A having perforations 2072 along the inner boundaries of the two heat transfer members 2010 and 2020. The perforations 2070 reduce lateral thermal conduction within the lower plate 2040A at the location of the thermal break 2030. And, the perforations 2072 reduce lateral thermal conduction within the upper plate 2050A at the location of the thermal break 2030.

In some embodiments, such as in the example heat spreader assembly 2000 of FIGS. 4A-4B, the heat transfer members 2010 and 2020 have a substantially symmetric shape and are of substantially equal shape and size. However, in some embodiments, different heat transfer members (e.g., 2010, 2020) within the heat spreader assembly 2000 can have different sizes and different shapes as needed to assist with limiting thermal communication (heat transfer) between the between the heat sources within the MCM (e.g., the higher operating temperature silicon photonics/CMOS die 1100) and the temperature sensitive devices within the MCM (e.g., SOA/III-V material die 1210, 1220, and laser/III-V material die 1230). It should be understood that in various embodiments, the heat spreader assembly 2000 can include as many heat transfer members (e.g., 2010, 2020) of whatever shape and size is necessary to satisfy the thermal requirements of the MCM.

Figure 6A:
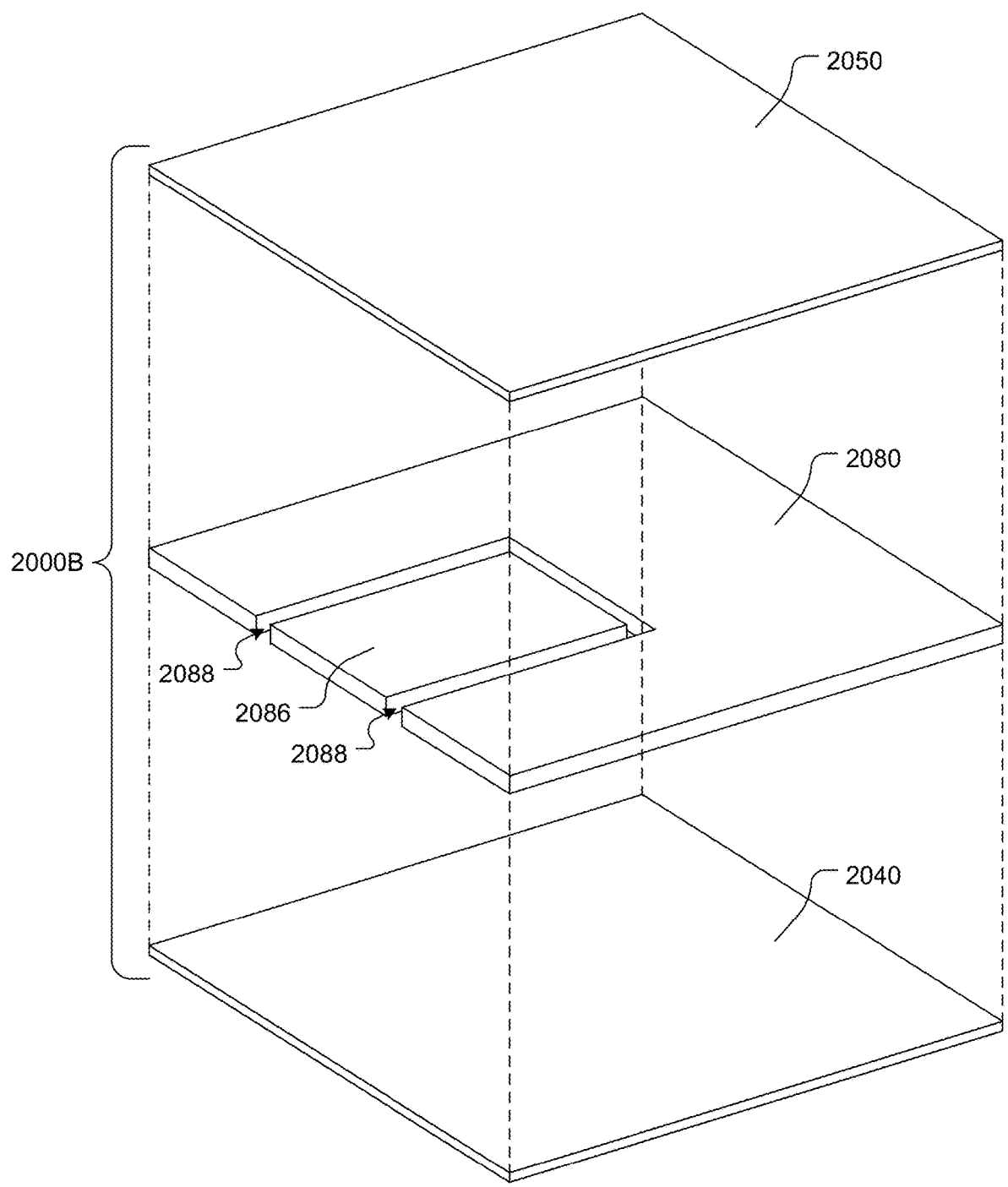
FIG. 6A shows a vertically exploded diagram of a heat spreader assembly that includes a U-shaped heat transfer member and a rectangular heat transfer member, in accordance with some embodiments of the present invention.
Figure 6B:
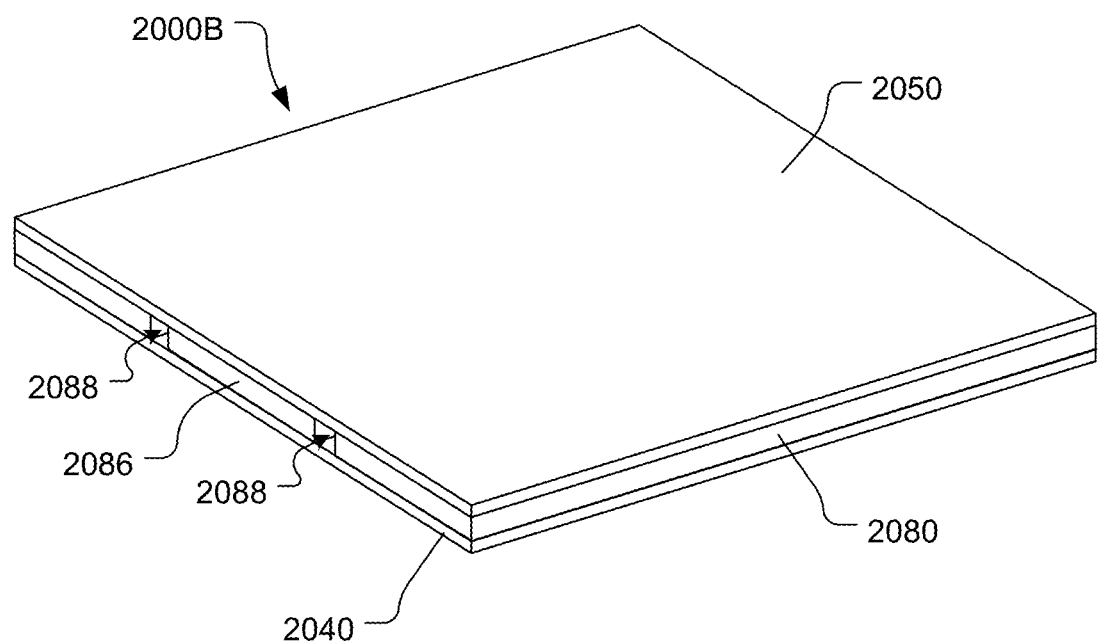
FIG. 6B shows the heat spreader assembly of FIG. 6A in an assembled form, in accordance with some embodiments of the present invention.

For example, FIG. 6A shows a vertically exploded diagram of a heat spreader assembly 2000B that includes a U-shaped heat transfer member 2080 and a rectangular heat transfer member 2086, with the heat transfer member 2080 wrapping around the heat transfer member 2086, in accordance with some embodiments of the present invention. FIG. 6B shows the heat spreader assembly 2000B in an assembled form, in accordance with some embodiments of the present invention. In the example heat spreader assembly 2000B, the U-shaped heat transfer member 2080 and the rectangular heat transfer member 2086 are separated from each other by a thermal break 2088. In some embodiments, the thermal break 2088 is formed by an air gap. The example heat spreader assembly 2000B includes the lower plate 2040 and the upper plate 2050. In some embodiments, the lower plate 2040 and/or the upper plate 2050 in the heat spreader assembly 2000B can include perforations along the thermal break 2088, in a manner similar to the perforations 2070, 2072 described with regard to FIGS. 5A and 5B.

Figure 7:
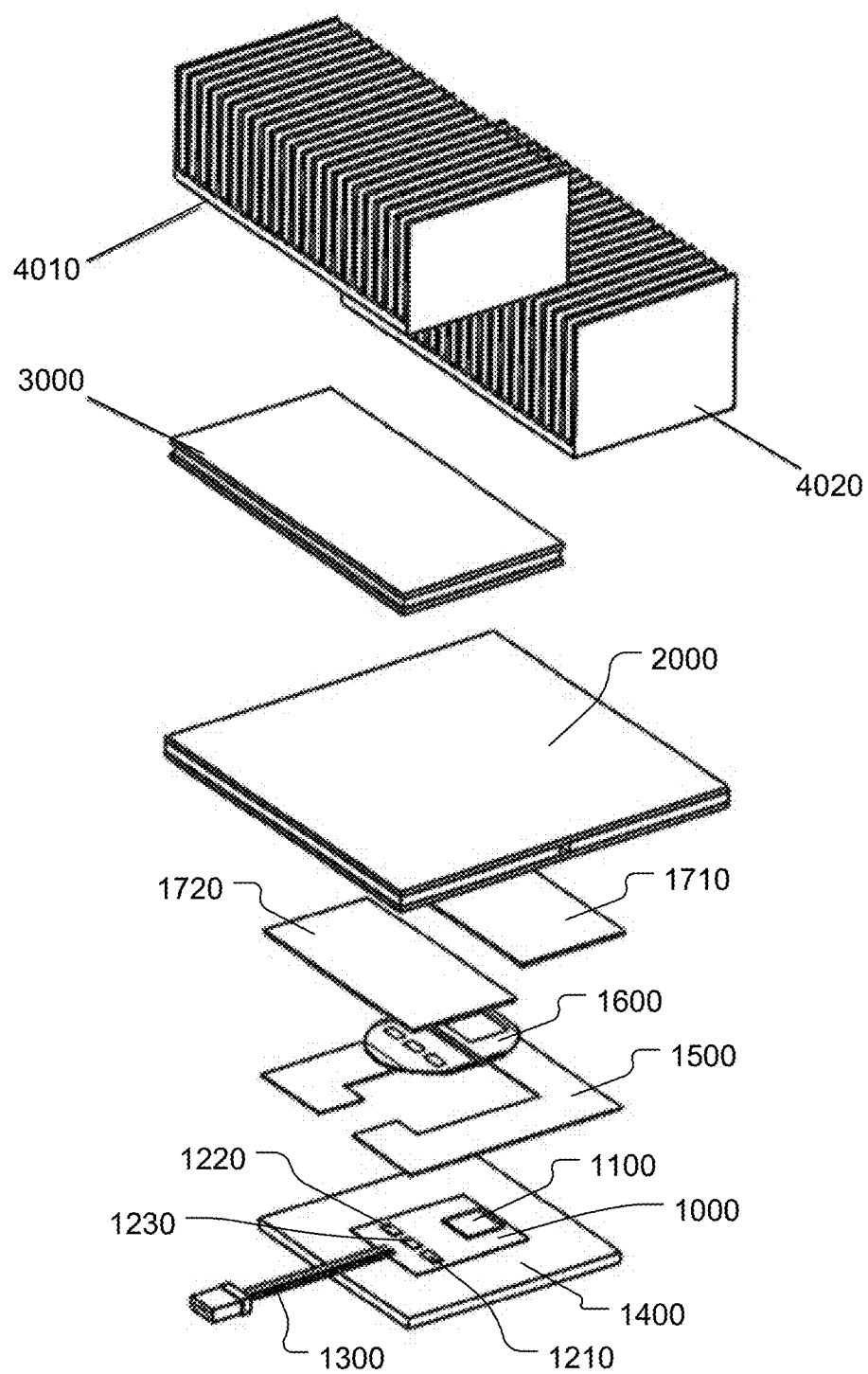
FIG. 7 shows a vertically exploded diagram of the MCM of FIGS. 1 through 4B, in conjunction with a thermoelectric cooler (TEC) and heat sink structures, in accordance with some embodiments of the present invention.

FIG. 7 shows a vertically exploded diagram of the MCM of FIGS. 1 through 4B, in conjunction with a thermoelectric cooler (TEC) 3000 and heat sinks 4010 and 4020, in accordance with some embodiments of the present invention. It should be understood that the MCM arrangement of FIG. 7 is based on a symmetric, bifurcated design, in which the lid structures 1710, 1720 and heat spreader assembly 2000 are arranged with thermal breaks so as to form two separate thermal control regions, such that heat transfer from the MCM to ambient is controllable in a bifurcated manner. In other embodiments, the MCM arrangement may be non-symmetric and/or include more than two separate thermal control regions, i.e., may be more than a bifurcated design. The TEC 3000 enables the user to effectively reduce the thermal resistance from a given region of the MCM to ambient. In the example of FIG. 7, the TEC 3000 is placed to increase heat transfer from the region of the MCM that has the temperature sensitive die (SOA/III-V material die 1210, 1220, and laser/III-V material die 1230 disposed on the interposer device 1000) to ambient. In various embodiments, the MCM can include a plurality of TEC's 3000. For example, in some embodiments, the MCM can include one or more TEC 3000 placed to affect heat transfer from all the die disposed on the interposer device 1000. In some embodiments, the TEC 3000 is configured to operate in accordance with the Peltier effect which creates a temperature difference by transferring heat between two electrical junctions through which an electrical current is made to flow, such that heat is removed at one electrical junction and deposited at the other electrical junction.

The heat sinks 4010 and 4020 are provided to dissipate heat to ambient. The example embodiment of FIG. 7 includes passive heat sinks 4010 and 4020. However, in various embodiments, the heat sinks 4010 and 4020 can be forced air heat sinks, and/or heat sinks with heat pipes, and/or vapor chambers, and/or water-cooled chill plates, and/or other types of heat sinks. Also, the example embodiment of FIG. 7 shows the heat sinks 4010 and 4020 as fin heat sinks. However, in other embodiments, the heat sinks 4010 and 4020 can be configured to include a pin array, folded fins, skived fins, or other configurations. In the example embodiment of FIG. 7, a vertical extent of the heat sink 4010 is less than a vertical extent of the heat sink 4020 to accommodate the vertical extent of the TEC 3000 and maintain a uniform overall vertical extent of the MCM. However, in some embodiments, the vertical extent of the MCM can vary over the footprint of the MCM.

Figure 8:
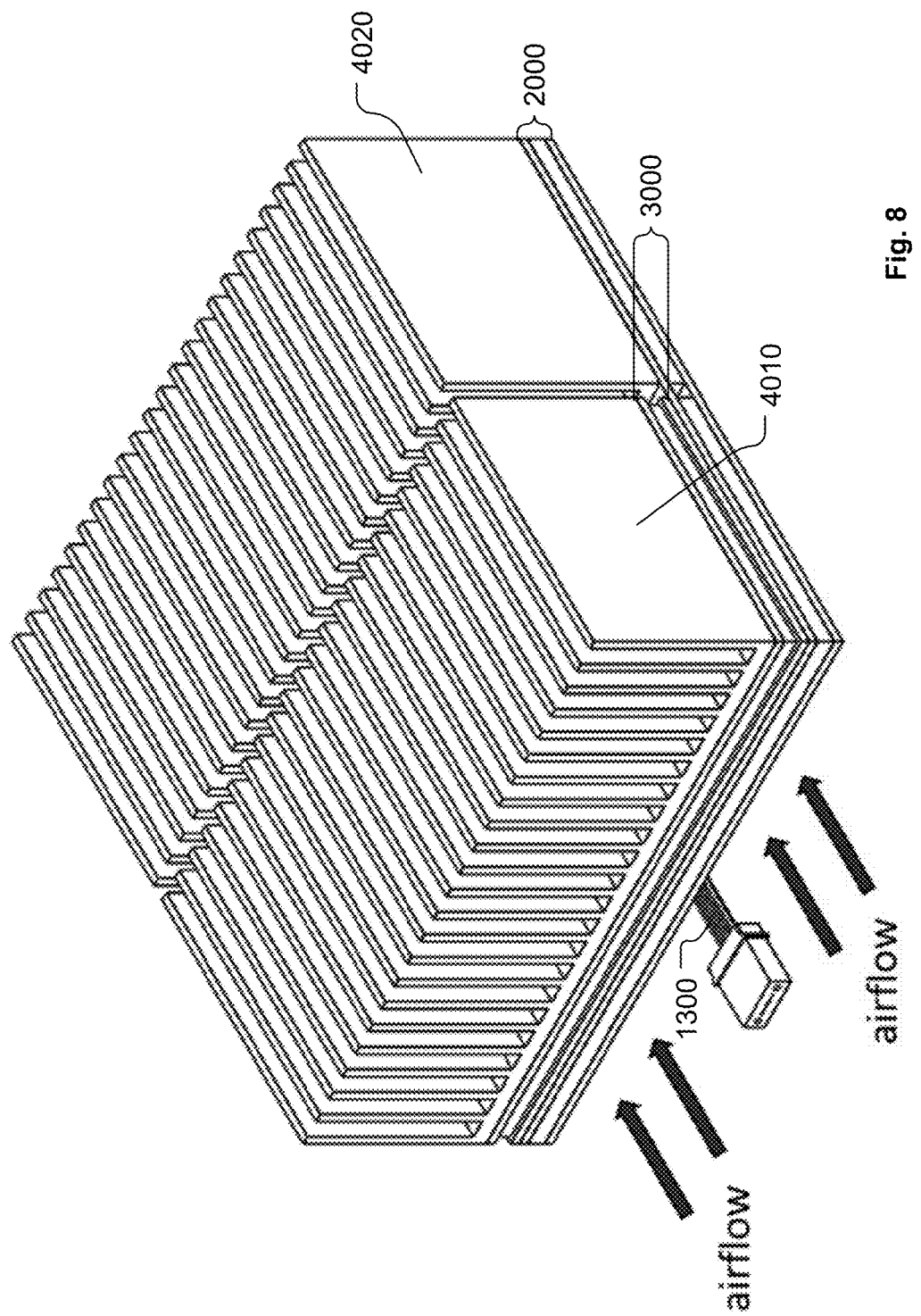
FIG. 8 shows the assembled MCM of FIG. 7, in accordance with some embodiments of the present invention.

FIG. 8 shows the assembled MCM of FIG. 7, in accordance with some embodiments of the present invention. Because the heat sinks 4010 and 4020 are parallel fin heat sinks, there is a preferred direction of airflow through the heat sinks 4010 and 4020. Specifically, the preferred direction of air flow through the heat sinks 4010 and 4020 is parallel to the fins. In the example of FIG. 8, the preferred direction of airflow through the heat sinks 4010 and 4020 is set so that the temperature sensitive die (SOA/III-V material die 1210, 1220, and laser/III-V material die 1230 disposed on the interposer device 1000) are positioned upstream from the heat generating die (silicon photonics/CMOS die 1100) disposed on the interposer device 1000, relative to a direction of air flow through the fins of the heat sinks 4010, 4020, so that the temperature sensitive die will have improved thermal performance. Specifically, because the heat sink 4010 associated with the temperature sensitive die is positioned upstream of the heat sink 4020 associated with the heat generating die, the heat sink 4010 is exposed to airflow of cooler temperature, thereby improving heat transfer from the fins of the heat sink 4010 to the air.

It should be understood that the physically/thermally separated lids 1710, 1720 and the bifurcated heat spreader assembly 2000 form parts of the thermal management system disclosed herein which functions to increase heat spreading within separate regions of the MCM, while retarding heat spreading between those separate regions of the MCM. Strategically placed thermal breaks between the separate lids 1710 and 1720 and within the heat spreader assembly 2000 serve to thermally isolate separate regions of the MCM so that temperature sensitive die within the MCM can be thermally shielded from heat generating die within the MCM.

Figure 9A:
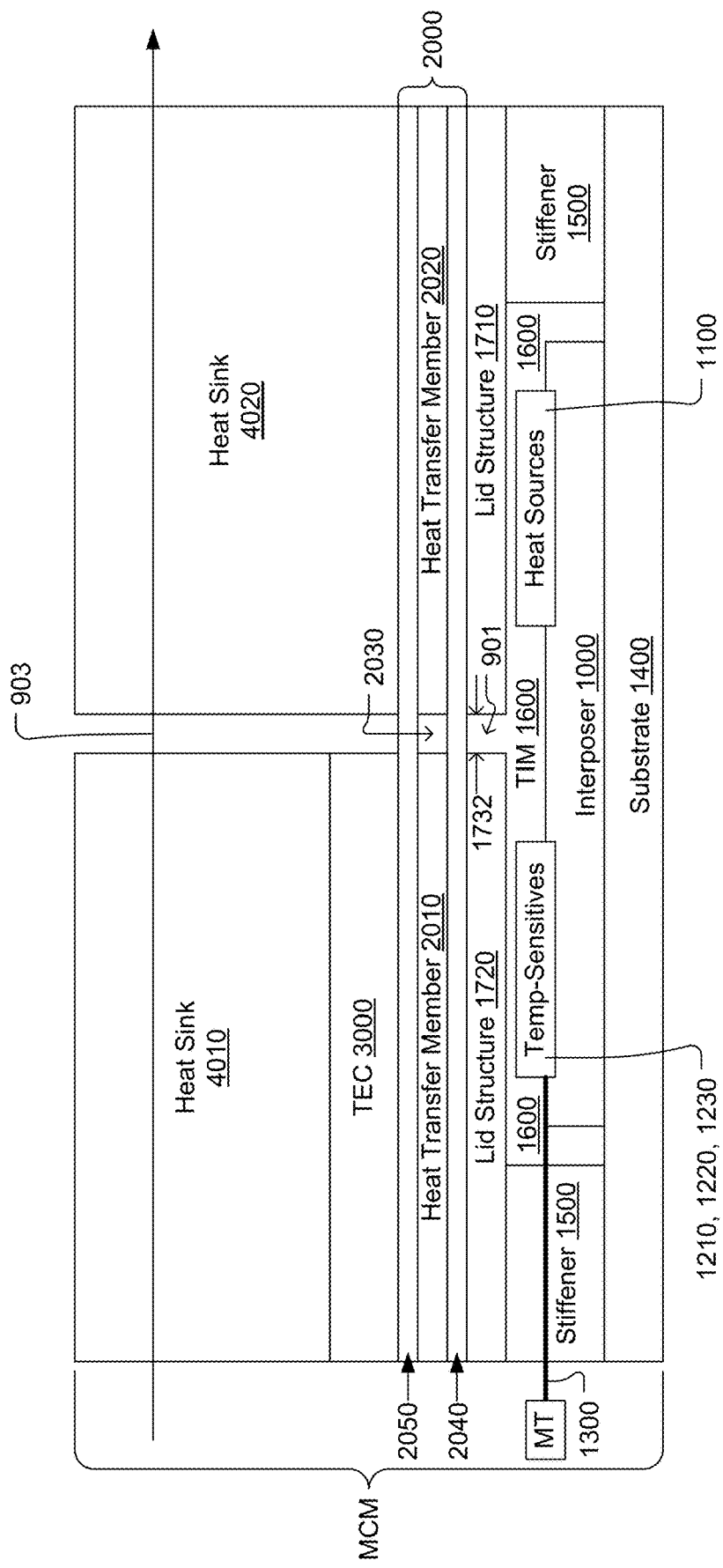
FIG. 9A shows a diagram of a vertical cross-section through an example MCM, in accordance with some embodiments of the present invention.

FIG. 9A shows a diagram of a vertical cross-section through an example MCM, in accordance with some embodiments of the present invention. The interposer 1000 is disposed on the substrate 1400. The stiffener structure 1500 is also disposed on the substrate 1400. The stiffener structure 1500 is configured to wrap around the interposer 1000. A number of temperature-sensitive devices 1210, 1220, 1230 are disposed on the interposer 1000. A number of heat sources 1100 are disposed on the interposer 1000. In some embodiments, the temperature-sensitive devices 1210, 1220, 1230 are disposed together in a first region on the interposer 1000, and the heat sources 1100 are disposed together in a second region on the interposer 1000, with the first and second regions thermally separated from each other to an extent possible. The optical fiber-to-chip or optical fiber-to-interposer assembly 1300 is configured and positioned to interface with photonics devices within the temperature-sensitive devices 1210, 1220, 1230. In some embodiments, the TIM material 1600 is disposed around and over the interposer 1000 and around and over the temperature-sensitive devices 1210, 1220, 1230 and around and over the heat sources 1100.

The lid structures 1710 and 1720 are positioned on the stiffener structure 1500 to extend over the interposer 1000. The lid structure 1710 is configured and positioned to extend over the heat sources 1100 within the MCM. The lid structure 1720 is configured and positioned to extend over the temperature sensitive devices 1210, 1220, 1230 within the MCM. The lid structure 1710 and the lid structure 1720 are also configured and positioned such that a thermal break 901 separates adjacent portions of the lid structures 1710 and 1720 from each other. The thermal break 901 is configured to limit transfer of heat emanating from the heat sources 1100 to the temperature sensitive devices 1210, 1220, 1230, by way of the lid structures 1710 and 1720. In some embodiments, the thermal break 901 is configured as the gap 1730 and the TIM 1600 is disposed on the interposer 1000 so that when the lid structures 1710 and 1720 are positioned on the stiffener structure 1500, an amount of the TIM 1600 flows into the gap 1730 between the lid structures 1710 and 1720. In some embodiments, the thermal break 901 is formed as an air gap. However, in other embodiments, the thermal break 901 can be formed by a solid material, such as a plastic material or dielectric material, among other materials of low thermal conductivity. The size 1732 of the thermal break 901 corresponds to a minimum heat transfer dimension across the thermal gap 901 between the lid structures 1710 and 1720. In some embodiments, the minimum heat transfer dimension across the thermal gap 901 is greater than zero and less than or equal to about 1 millimeter as measured between the two adjacent lid structures 1710 and 1720.

The heat spreader assembly 2000 is positioned in thermally conductive interface with the lid structures 1710 and 1720. It should be understood that thermally conductive interface, as used herein with regard positioning of a first structure in thermally conductive interface with a second structure, can refer to a particular surface of the first structure being in either partial or complete physical contact with a particular surface of the second structure, and/or can refer to disposal of a thermally conductive bonding material between a particular surface of the first structure and a particular surface of the second structure. In the example of FIG. 9A, the heat spreader assembly 2000 includes the lower plate 2040 and the upper plate 2050. The heat spreader assembly 2000 also includes the heat transfer members 2010 and 2020 positioned between the lower plate 2040 and the upper plate 2050 and in thermally conductive interface with the lower plate 2040 an the upper plate 2050. The heat transfer members 2010 and 2020 are separated from each other by the thermal break 2030. In some embodiments, the thermal break 2030 is formed as an air gap. However, in other embodiments, the thermal break 2030 can be formed by a solid material, such as a plastic material or dielectric material, among other materials of low thermal conductivity. The heat transfer member 2010 is configured to promote transfer of thermal energy from the lid structure 1720 toward the ambient environment outside of the MCM. The heat transfer member 2020 is configured to promote transfer of thermal energy from the lid structure 1710 toward the ambient environment outside of the MCM. Also, in some embodiments, the lower plate 2040 and the upper plate 2050 are configured to maintain a spatial relationship between the heat transfer members 2010 and 2020, while limiting thermal communication between the heat transfer members 2010 and 2020. In the example of FIG. 9A, the lower plate 2040 vertically bounds the thermal break 2030 within the heat spreader assembly 2000. Also, in the example of FIG. 9A, the upper plate 2050 vertically bounds the thermal break 2030 within the heat spreader assembly 2000. In the example of FIG. 9A, the TEC 3000 is positioned in thermally conductive interface with the heat spreader assembly 2000 at a location above the heat transfer member 2010. The TEC 3000 is configured to promote transfer of thermal energy from the heat transfer member 2010 toward the ambient environment outside of the MCM. It should be understood that the TEC 3000 provides for improved cooling of the region below the lid structure 1720 where the temperature-sensitive devices 1210, 1220, 1230 are located.

The heat sink structure 4010 is positioned in thermally conductive interface with the TEC 3000. The heat sink structure 4020 is positioned in thermally conductive interface with the heat spreader assembly 2000. More specifically, the heat sink structure 4020 is positioned above the heat transfer member 2020 to promote transfer of thermal energy from the heat transfer member 2020 toward the ambient environment outside of the MCM. In some embodiments, the fin structures of the heat sink structure 4010 and the fin structures of the heat sink structure 4020 are oriented so that air can be flowed between the fin structures in a direction 903 moving from the heat sink structure 4010 toward and through the heat sink structure 4020. In this manner, cooler air flows through the heat sink structure 4010 that is positioned in the heat transfer path away from the temperature-sensitive devices 1210, 1220, 1230, thereby improving the efficiency of heat transfer away from the temperature-sensitive devices 1210, 1220, 1230.

Figure 9B:
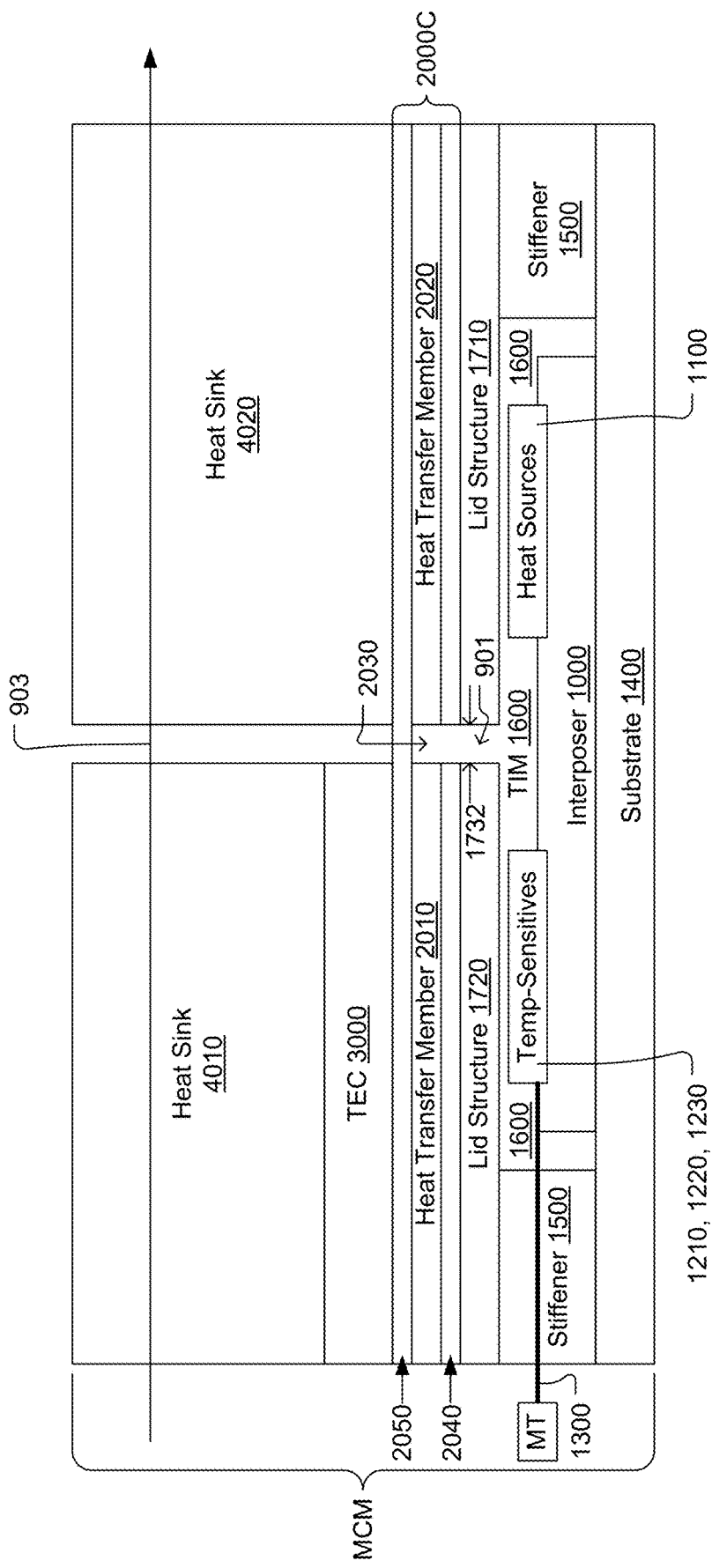
FIG. 9B shows a diagram of a vertical cross-section through a variation of the example MCM of FIG. 9A, in which another heat spreader assembly is used, in accordance with some embodiments of the present invention.

FIG. 9B shows a diagram of a vertical cross-section through a variation of the example MCM of FIG. 9A, in which another heat spreader assembly 2000C is used, in accordance with some embodiments of the present invention. In the heat spreader assembly 2000C, the lower plate 2040 of the heat spreader assembly 2000C is either perforated along the thermal break 2030 or not present along the thermal break 2030. In some embodiments, the heat spreader assembly 2000C is configured and positioned such that the thermal break 901 between the lid structures 1710 and 1720 is contiguous with the thermal break 2030 between the heat transfer members 2010 and 2020. The configuration of the lower plate 2040 in the heat spreader assembly 2000C can improve thermal separation between the lid structure 1710 and the lid structure 1720. Also, in some embodiments, the upper plate 2050 in the heat spreader assembly 2000C can function to maintain a spatial relationship between the heat transfer member 2010 and the heat transfer member 2020. In some embodiments, the lower plate 2040 in the heat spreader assembly 2000C is formed as a contiguous structure at locations outside of the footprint of the interposer 1000, such as at locations that overlie the stiffener structure 1500.

Figure 9C:
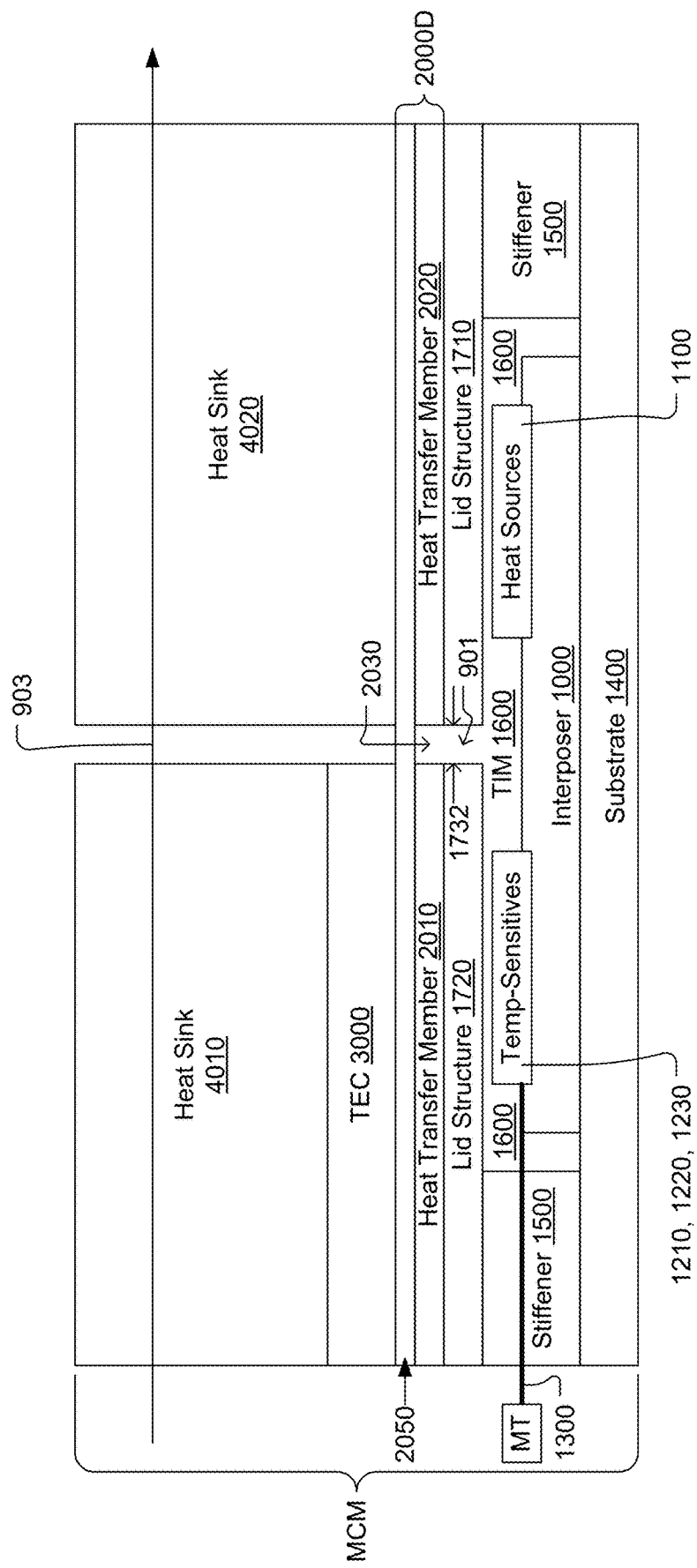
FIG. 9C shows a diagram of a vertical cross-section through a variation of the example MCM of FIG. 9A, in which another heat spreader assembly is used, in accordance with some embodiments of the present invention.

FIG. 9C shows a diagram of a vertical cross-section through a variation of the example MCM of FIG. 9A, in which another heat spreader assembly 2000D is used, in accordance with some embodiments of the present invention. The heat spreader assembly 2000D does not include the lower plate 2040 that is present in the heat spreader assembly 2000. The heat spreader assembly 2000D is configured and positioned such that the heat transfer member 2010 is in thermally conductive interface with the lid structure 1720, and the heat transfer member 2020 is in thermally conductive interface with the lid structure 1710. In this manner, the thermal break 2030 is contiguous with the thermal break 901. The upper plate 2050 in the heat spreader assembly 2000D functions to maintain a spatial relationship between the heat transfer member 2010 and the heat transfer member 2020.

It should be understood that a thermal management system for a multi-chip-module (MCM) is disclosed herein. The thermal management system can include a plurality of lid structures (e.g., 1710, 1720) including at least one lid structure (e.g., 1710) configured to overlie one or more heat sources (e.g., 1100) within the MCM and at least one lid structure (e.g., 1720) configured to overlie one or more temperature sensitive components (e.g., 1210, 1220, 1230) within the MCM. The plurality of lid structures are configured and positioned such that each lid structure is separated from each adjacent lid structure by a corresponding thermal break (e.g., 901). A heat spreader assembly (e.g., 2000, 2000A, 2000B, 2000C, 2000D) is positioned in thermally conductive interface with the plurality of lid structures. The heat spreader assembly is configured to cover an aggregation of the plurality of lid structures. The heat spreader assembly includes a plurality of separately defined heat transfer members (e.g., 2010, 2020) respectively configured and positioned to overlie the plurality of lid structures. The heat spreader assembly is configured to limit heat transfer between different heat transfer members within the heat spreader assembly, such as by way of a thermal break (e.g., 2030).

In some embodiments, each of the plurality of lid structures (e.g., 1710, 1720) is formed of a material having a thermal conductivity of at least 100 Watts per meter-Kelvin (W/m-K). In some embodiments, each of the plurality of lid structures (e.g., 1710, 1720) is formed of copper, or aluminum, or copper alloy, or aluminum alloy. In some embodiments, each thermal break (e.g., 901) that separates any two adjacent ones of the plurality of lid structures (e.g., 1710, 1720) has a minimum heat transfer dimension (e.g., 1732) greater than zero and less than or equal to about 1 millimeter as measured between the two adjacent ones of the plurality of lid structures. In some embodiments, a vertical thickness of each of the plurality of lid structures (e.g., 1710, 1720) is greater than zero and less than or equal to about 1 millimeter.

In some embodiments, the one or more heat sources (e.g., 1100) within the multi-chip-module include at least one silicon photonics die or at least one CMOS die. In some embodiments, the one or more temperature sensitive components (e.g., 1210, 1220, 1230) include at least one III-V material die. In some embodiments, each of the plurality of lid structures (e.g., 1710, 1720) is configured to interface with a stiffener structure (e.g., 1500) of the MCM. In some embodiments, at least one thermal break (e.g., 901) that separates two adjacent ones of the plurality of lid structures (e.g., 1710, 1720) is formed as a region of thermal interface material (e.g., 1600) flowed into the region between the two adjacent ones of the plurality of lid structures during placement of the two adjacent ones of the plurality of lid structures on the MCM. In some embodiments, at least one thermal break (e.g., 901) that separates two adjacent ones of the plurality of lid structures (e.g., 1710, 1720) is formed as a region of air. In some embodiments, at least one thermal break (e.g., 901) that separates two adjacent ones of the plurality of lid structures (e.g., 1710, 1720) is formed as a solid material. In some embodiments, the plurality of lid structures (e.g., 1710, 1720) and any thermal break (e.g., 901) that separates two adjacent ones of the plurality of lid structures are collectively formed as a single unit structure.

In some embodiments, the plurality of lid structures (e.g., 1710, 1720) have substantially co-planar top surfaces. In some embodiments, the heat spreader assembly (e.g., 2000, 2000A, 2000C) includes a lower plate (e.g., 2040) and an upper plate (e.g., 2050), with the plurality of separately defined heat transfer members (e.g., 2010, 2020) disposed between the lower plate (e.g., 2040) and the upper plate (e.g., 2050), and with the lower plate (e.g., 2040) positioned in thermally conductive interface with the substantially co-planar top surfaces of the plurality of lid structures (e.g., 1710, 1720). In some embodiments, each of the plurality of separately defined heat transfer members (e.g., 2010, 2020) has a physical connection to at least one of the lower plate (e.g., 2040) and upper plate (e.g., 2050). In some embodiments, the lower plate (e.g., 2040) and upper plate (e.g., 2050) maintain physical positions of the plurality of separately defined heat transfer members (e.g., 2010, 2020) relative to each other.

In some embodiments, each heat transfer member of the plurality of separately defined heat transfer members (e.g., 2010, 2020) is separated from each adjacent heat transfer member of the plurality of separately defined heat transfer members by a corresponding thermal break (e.g., 2030). In some embodiments, each thermal break (e.g., 2030) between any two heat transfer members of the plurality of separately defined heat transfer members (e.g., 2010, 2020) is vertical bounded by at least one of the lower plate (e.g., 2040) and the upper plate (e.g., 2050). In some embodiments, at least one thermal break (e.g., 2030) between any two heat transfer members of the plurality of separately defined heat transfer members (e.g., 2010, 2020) is formed as a region of air. In some embodiments, at least one thermal break (e.g., 2030) between any two heat transfer members of the plurality of separately defined heat transfer members (e.g., 2010, 2020) is formed as a solid material. In some embodiments, at least one of the lower plate (e.g., 2040) and the upper plate (e.g., 2050) is perforated along at least one thermal break (e.g., 2030) located between adjacent heat transfer members (e.g., 2010, 2020) within the heat spreader assembly (e.g., 2000A, 2000C).

In some embodiments, the lower plate (e.g., 2040) has a vertical thickness of less than or equal to about 1 millimeter, and the upper plate (e.g., 2050) has a vertical thickness of less than or equal to about 1 millimeter. In some embodiments, at least one of the plurality of separately defined heat transfer members (e.g., 2010, 2020) is formed as a solid material having a thermal conductivity of at least 200 W/m-K. In some embodiments, at least one of the plurality of separately defined heat transfer members (e.g., 2010, 2020) is formed as a vapor chamber. In some embodiments, at least one of the plurality of separately defined heat transfer members (e.g., 2010, 2020) is formed as a heat spreader plate with integrated heat pipes.

In some embodiments, the thermal management system includes a thermoelectric cooler (e.g., 3000) is positioned in thermally conductive interface with the heat spreader assembly (e.g., 2000, 2000A, 2000B, 2000C, 2000D). The thermoelectric cooler (e.g., 3000) is configured to overlie at least one heat transfer member (e.g., 2010) within the heat spreader assembly (e.g., 2000, 2000A, 2000B, 2000C, 2000D) that is positioned to overlie at least one lid structure (e.g., 1720) of the plurality of lid structures (e.g., 1710, 1720) that is positioned to overlie one or more temperature sensitive components (e.g., 1210, 1220, 1230) within the MCM. In some embodiments, the thermal management system includes a plurality of heat sink structures (e.g., 4010, 4020) corresponding to the plurality of heat transfer members (e.g., 2010, 2020) within the heat spreader assembly (e.g., 2000, 2000A, 2000B, 2000C, 2000D). In some embodiments, the plurality of heat sink structures (e.g., 4010, 4020) are positioned to respectively overlie the plurality of heat transfer members (e.g., 2010, 2020) within the heat spreader assembly (e.g., 2000, 2000A, 2000B, 2000C, 2000D). Each of the plurality of heat sink structures (e.g., 4010, 4020) is in thermally conductive interface with either the heat spreader assembly (e.g., 2000, 2000A, 2000B, 2000C, 2000D) or the thermoelectric cooler (e.g., 3000). In some embodiments, the plurality of heat sink structures (e.g., 4010, 4020) are configured and positioned physically separate from each other. In some embodiments, each of the plurality of heat sink structures (e.g., 4010, 4020) is configured to have fin structures of substantially parallel orientation.

Figure 10:
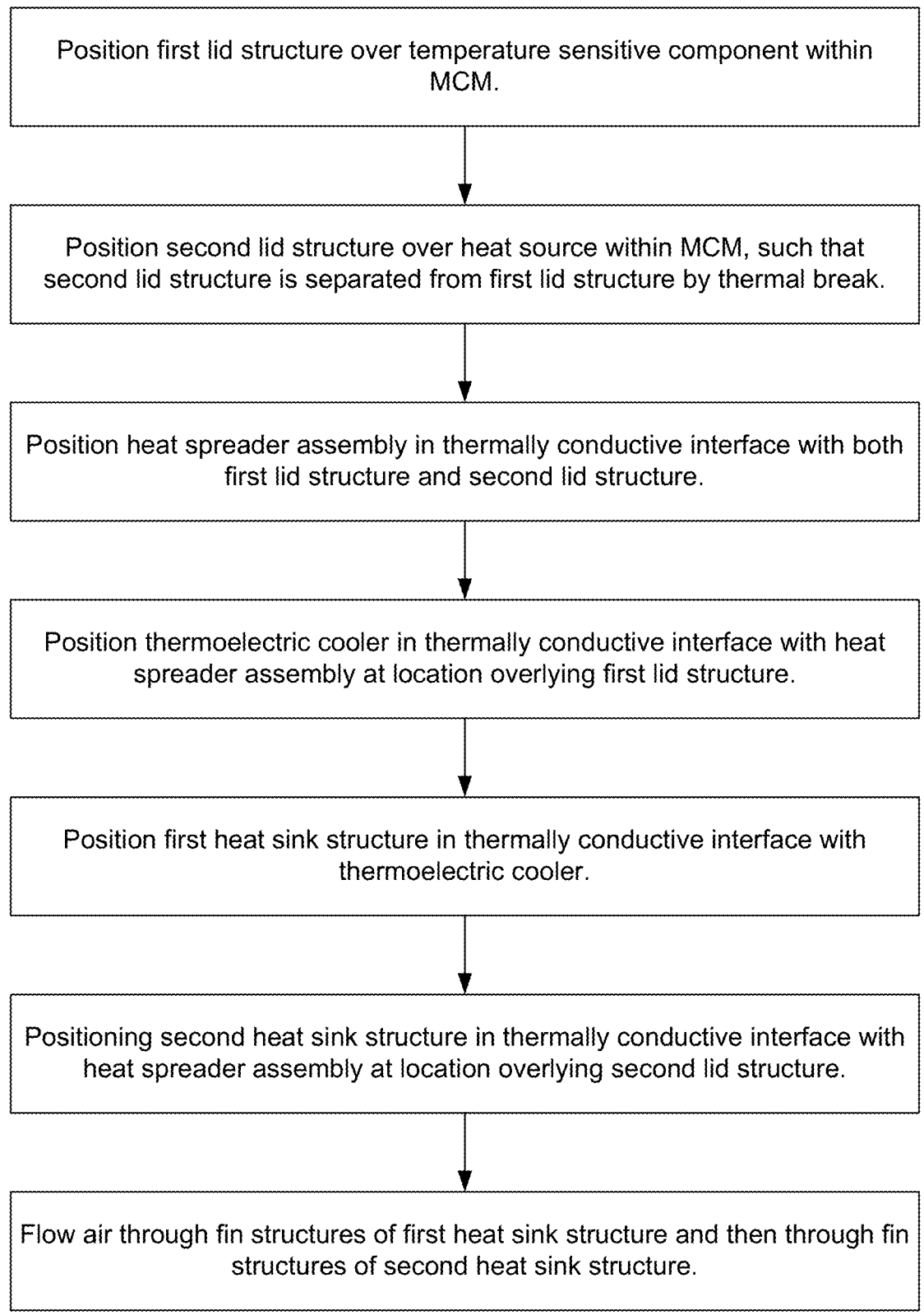
FIG. 10 shows a flowchart of a method for thermal management of an MCM, in accordance with some embodiments of the present invention.

FIG. 10 shows a flowchart of a method for thermal management of a multi-chip-module (MCM), in accordance with some embodiments of the present invention. The method includes an operation 5001 for positioning a first lid structure (e.g., 1720) over a temperature sensitive component (e.g., 1210, 1220, 1230) within the MCM. In some embodiments, the temperature sensitive component (e.g., 1210, 1220, 1230) includes at least one III-V material die. The method also includes an operation 5003 for positioning a second lid structure (e.g., 1710) over a heat source (e.g., 1100) within the MCM, such that the second lid structure (e.g., 1710) is separated from the first lid structure (e.g., 1720) by a thermal break (e.g., 901). In some embodiments, the heat source (e.g., 1100) within the MCM includes at least one silicon photonics die or at least one CMOS die. In some embodiments, the first lid structure (e.g., 1720) and the second lid structure (e.g., 1710) are positioned in physical contact with a stiffener structure (e.g., 1500) of the MCM. In some embodiments, the first lid structure (e.g., 1720) and the second lid structure (e.g., 1710) are positioned over a thermal interface material (e.g., 1600), such that the thermal interface material (e.g., 1600) flows into the thermal break (e.g., 901) between the first lid structure (e.g., 1720) and the second lid structure (e.g., 1710). In some embodiments, the thermal break (e.g., 901) between the first lid structure (e.g., 1720) and the second lid structure (e.g., 1710) is formed as a region of air. In some embodiments, the thermal break (e.g., 901) between the first lid structure (e.g., 1720) and the second lid structure (e.g., 1710) is formed as a solid material.

The method also includes an operation 5005 for positioning a heat spreader assembly (e.g., 2000, 2000A, 2000B, 2000C, 2000D) in thermally conductive interface with both the first lid structure (e.g., 1720) and the second lid structure (e.g., 1710). The heat spreader assembly (e.g., 2000, 2000A, 2000B, 2000C, 2000D) includes a first heat transfer member (e.g., 2010) configured and positioned to overlie the first lid structure (e.g., 1720). The heat spreader assembly (e.g., 2000, 2000A, 2000B, 2000C, 2000D) also includes a second heat transfer member (e.g., 2020) configured and positioned to overlie the second lid structure (e.g., 1710). The heat spreader assembly (e.g., 2000, 2000A, 2000B, 2000C, 2000D) is configured to limit heat transfer between the first heat transfer member (e.g., 2010) and the second heat transfer member (e.g., 2020).

In some embodiments, the heat spreader assembly (e.g., 2000, 2000A, 2000B, 2000C) includes a lower plate (e.g., 2040) and an upper plate (e.g., 2050), with the first heat transfer member (e.g., 2010) and the second heat transfer member (e.g., 2020) disposed between the lower plate (e.g., 2040) and the upper plate (e.g., 2050), and with the lower plate (e.g., 2040) in thermally conductive interface with the first lid structure (e.g., 1720) and the second lid structure (e.g., 1710). In some embodiments, the first heat transfer member (e.g., 2010) and the second heat transfer member (e.g., 2020) are separated from each other by a thermal break (e.g., 2030). In some embodiments, the thermal break (e.g., 2030) between the first heat transfer member (e.g., 2010) and the second heat transfer member (e.g., 2020) is vertically bounded by at least one of the lower plate (e.g., 2040) and the upper plate (e.g., 2050). In some embodiments, the thermal break (e.g., 2030) between the first heat transfer member (e.g., 2010) and the second heat transfer member (e.g., 2020) is formed as a region of air. In some embodiments, the thermal break (e.g., 2030) between the first heat transfer member (e.g., 2010) and the second heat transfer member (e.g., 2020) is formed as a solid material. In some embodiments, the lower plate (e.g., 2040) is perforated along the thermal break (e.g., 2030) between the first heat transfer member (e.g., 2010) and the second heat transfer member (e.g., 2020). In some embodiments, the upper plate (e.g., 2050) is perforated along the thermal break (e.g., 2030) between the first heat transfer member (e.g., 2010) and the second heat transfer member (e.g., 2020). In some embodiments, the lower plate (e.g., 2040) is perforated along the thermal break (e.g., 2030) between the first heat transfer member (e.g., 2010) and the second heat transfer member (e.g., 2020), and the upper plate (e.g., 2050) is perforated along the thermal break (e.g., 2030) between the first heat transfer member (e.g., 2010) and the second heat transfer member (e.g., 2020).

In some embodiments, the method includes an optional operation 5007 for positioning a thermoelectric cooler (e.g., 3000) in thermally conductive interface with the heat spreader assembly (e.g., 2000, 2000A, 2000B, 2000C, 2000D). The thermoelectric cooler (e.g., 3000) is configured and positioned to overlie the first heat transfer member (e.g., 2010) within the heat spreader assembly (e.g., 2000, 2000A, 2000B, 2000C, 2000D) that is positioned to overlie the first lid structure (e.g., 1720) that is positioned to overlie the temperature sensitive component (e.g., 1210, 1220, 1230) within the MCM.

In some embodiments, the method includes an optional operation 5009 for positioning a first heat sink structure (e.g., 4010) in thermally conductive interface with the thermoelectric cooler (e.g., 3000). In some embodiments, the method includes an optional operation 5011 for positioning a second heat sink structure (e.g., 4020) in thermally conductive interface with the heat spreader assembly (e.g., 2000, 2000A, 2000B, 2000C, 2000D). The second heat sink structure (e.g., 4020) is configured and positioned to overlie the second heat transfer member (e.g., 2020) within the heat spreader assembly (e.g., 2000, 2000A, 2000B, 2000C, 2000D) that is positioned to overlie the second lid structure (e.g., 1710) that is positioned to overlie the heat sources (e.g., 1100) within the MCM. In some embodiments, the first heat sink structure (e.g., 4010) and the second heat sink structure (e.g., 4020) are configured and positioned physically separate from each other. In some embodiments, each of the first heat sink structure (e.g., 4010) and the second heat sink structure (e.g., 4020) is configured to have fin structures of substantially parallel orientation. In some embodiments, the method includes an optional operation 5013 for flowing air through the fin structures of the first heat sink structure (e.g., 4010) and then through the fin structures of the second heat sink structure (e.g., 4020).

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing invention has been described in some detail for purposes of clarity of understanding, it will be apparent that certain changes and modifications can be practiced. Accordingly, the present embodiments are to be considered as illustrative and not restrictive, and the invention is not to be limited to the details given herein, but may be modified within the scope and equivalents of the described embodiments.

What is claimed is:

1. A thermal management system for a multi-chip-module, comprising:
    a plurality of lid structures including at least one lid structure configured to overlie one or more heat sources within the multi-chip-module and at least one lid structure configured to overlie one or more temperature sensitive components within the multi-chip-module, the plurality of lid structures configured and positioned such that each lid structure is separated from each adjacent lid structure by a corresponding thermal break; and
    a heat spreader assembly positioned in thermally conductive interface with the plurality of lid structures, the heat spreader assembly configured to cover an aggregation of the plurality of lid structures, the heat spreader assembly including a plurality of separately defined heat transfer members respectively configured and positioned to overlie the plurality of lid structures, the heat spreader assembly configured to limit heat transfer between different heat transfer members within the heat spreader assembly, wherein the heat spreader assembly includes a lower plate and an upper plate, with the plurality of separately defined heat transfer members disposed between the lower plate and the upper plate.

2. The thermal management system for the multi-chip-module as recited in claim 1, wherein each of the plurality of lid structures is formed of a material having a thermal conductivity of at least 100 Watts per meter-Kelvin (W/m-K).

3. The thermal management system for the multi-chip-module as recited in claim 1, wherein each of the plurality of lid structures is formed of copper, or aluminum, or copper alloy, or aluminum alloy.

4. The thermal management system for the multi-chip-module as recited in claim 1, wherein each thermal break that separates any two adjacent ones of the plurality of lid structures has a minimum heat transfer dimension greater than zero and less than or equal to about 1 millimeter as measured between the two adjacent ones of the plurality of lid structures.

5. The thermal management system for the multi-chip-module as recited in claim 1, wherein a vertical thickness of each of the plurality of lid structures is greater than zero and less than or equal to about 1 millimeter.

6. The thermal management system for the multi-chip-module as recited in claim 1, wherein the one or more heat sources within the multi-chip-module include at least one silicon photonics die or at least one CMOS (Complementary Metal-Oxide Semiconductor) die.

7. The thermal management system for the multi-chip-module as recited in claim 1, wherein the one or more temperature sensitive components include at least one III-V material die.

8. The thermal management system for the multi-chip-module as recited in claim 1, wherein each of the plurality of lid structures is configured to interface with a stiffener structure of the multi-chip-module.

9. The thermal management system for the multi-chip-module as recited in claim 1, wherein at least one thermal break that separates two adjacent ones of the plurality of lid structures is formed as a region of thermal interface material flowed into the region between the two adjacent ones of the plurality of lid structures during placement of the two adjacent ones of the plurality of lid structures on the multi-chip-module.

10. The thermal management system for the multi-chip-module as recited in claim 1, wherein at least one thermal break that separates two adjacent ones of the plurality of lid structures is formed as a region of air.

11. The thermal management system for the multi-chip-module as recited in claim 1, wherein at least one thermal break that separates two adjacent ones of the plurality of lid structures is formed as a solid material.

12. The thermal management system for the multi-chip-module as recited in claim 1, wherein the plurality of lid structures and any thermal break that separates two adjacent ones of the plurality of lid structures are collectively formed as a single unit structure.

13. The thermal management system for the multi-chip-module as recited in claim 1, wherein the plurality of lid structures have substantially co-planar top surfaces.

14. The thermal management system for the multi-chip-module as recited in claim 13, wherein the lower plate of the heat spreader assembly is positioned in thermally conductive interface with the substantially co-planar top surfaces of the plurality of lid structures.

15. The thermal management system for the multi-chip-module as recited in claim 1, wherein each of the plurality of separately defined heat transfer members has a physical connection to at least one of the lower plate and upper plate, the lower plate and upper plate maintaining physical positions of the plurality of separately defined heat transfer members relative to each other.

16. The thermal management system for the multi-chip-module as recited in claim 1, wherein each heat transfer member of the plurality of separately defined heat transfer members is separated from each adjacent heat transfer member of the plurality of separately defined heat transfer members by a corresponding thermal break.

17. The thermal management system for the multi-chip-module as recited in claim 16, wherein each thermal break between any two heat transfer members of the plurality of separately defined heat transfer members is vertical bounded by at least one of the lower plate and the upper plate.

18. The thermal management system for the multi-chip-module as recited in claim 16, wherein at least one thermal break between any two heat transfer members of the plurality of separately defined heat transfer members is formed as a region of air.

19. The thermal management system for the multi-chip-module as recited in claim 16, wherein at least one thermal break between any two heat transfer members of the plurality of separately defined heat transfer members is formed as a solid material.

20. The thermal management system for the multi-chip-module as recited in claim 16, wherein at least one of the lower plate and the upper plate is perforated along at least one thermal break located between adjacent heat transfer members within the heat spreader assembly.

21. The thermal management system for the multi-chip-module as recited in claim 1, wherein the lower plate has a vertical thickness of less than or equal to about 1 millimeter, and the upper plate has a vertical thickness of less than or equal to about 1 millimeter.

22. The thermal management system for the multi-chip-module as recited in claim 1, wherein at least one of the plurality of separately defined heat transfer members is formed as a solid material having a thermal conductivity of at least 200 Watts per meter-Kelvin (W/m-K).

23. The thermal management system for the multi-chip-module as recited in claim 1, wherein at least one of the plurality of separately defined heat transfer members is formed as a vapor chamber.

24. The thermal management system for the multi-chip-module as recited in claim 1, wherein at least one of the plurality of separately defined heat transfer members is formed as a heat spreader plate with integrated heat pipes.

25. A thermal management system for a multi-chip-module, comprising:
- a plurality of lid structures including at least one lid structure configured to overlie one or more heat sources within the multi-chip-module and at least one lid structure configured to overlie one or more temperature sensitive components within the multi-chip-module, the plurality of lid structures configured and positioned such that each lid structure is separated from each adjacent lid structure by a corresponding thermal break;
- a heat spreader assembly positioned in thermally conductive interface with the plurality of lid structures, the heat spreader assembly configured to cover an aggregation of the plurality of lid structures, the heat spreader assembly including a plurality of separately defined heat transfer members respectively configured and positioned to overlie the plurality of lid structures, the heat spreader assembly configured to limit heat transfer between different heat transfer members within the heat spreader assembly; and
- a thermoelectric cooler positioned in thermally conductive interface with the heat spreader assembly, the thermoelectric cooler configured to overlie at least one heat transfer member within the heat spreader assembly that is positioned to overlie at least one lid structure of the plurality of lid structures that is positioned to overlie one or more temperature sensitive components within the multi-chip-module.

26. The thermal management system for the multi-chip-module as recited in claim 25, further comprising:
- a plurality of heat sink structures corresponding to the plurality of heat transfer members within the heat spreader assembly, the plurality of heat sink structures positioned to respectively overlie the plurality of heat transfer members within the heat spreader assembly, each of the plurality of heat sink structures in thermally conductive interface with either the heat spreader assembly or the thermoelectric cooler.

27. The thermal management system for the multi-chip-module as recited in claim 26, wherein the plurality of heat sink structures are configured and positioned physically separate from each other.

28. The thermal management system for the multi-chip-module as recited in claim 26, wherein each of the plurality of heat sink structures is configured to have fin structures of substantially parallel orientation.

* * * * *